United States Patent
Nishimoto et al.

(10) Patent No.: US 6,488,995 B1
(45) Date of Patent: Dec. 3, 2002

(54) METHOD OF FORMING MICROCRYSTALLINE SILICON FILM, METHOD OF FABRICATING PHOTOVOLTAIC CELL USING SAID METHOD, AND PHOTOVOLTAIC DEVICE FABRICATED THEREBY

(75) Inventors: Tomonori Nishimoto, Tsukuba (JP); Masafumi Sano, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/250,243

(22) Filed: Feb. 16, 1999

(30) Foreign Application Priority Data

Feb. 17, 1998  (JP) ............................................ 10-033456

(51) Int. Cl.$^7$ .......................... C23C 16/24; H05H 1/02; H01L 31/0264; H01L 31/04
(52) U.S. Cl. ........................ 427/574; 427/588; 427/585; 427/595; 427/573; 427/578; 438/96; 438/97; 438/484; 438/482; 438/488; 438/485; 438/490; 136/258
(58) Field of Search .......................... 438/96, 97, 484, 438/482, 488, 485, 490; 427/588, 585, 574, 595, 573, 578; 136/258 AM, 258 PC, 264, 249 TJ; 257/431, 52, 53, 66

(56) References Cited

U.S. PATENT DOCUMENTS

| | | | | | |
|---|---|---|---|---|---|
| 4,492,736 | A | * | 1/1985 | Tanner | ........................ 428/446 |
| 4,933,203 | A | | 6/1990 | Curtins | ........................ 438/485 |
| 5,486,238 | A | * | 1/1996 | Nakagawa et al. | ......... 136/259 |
| 5,582,880 | A | * | 12/1996 | Mochizuki et al. | ......... 427/569 |
| 5,858,819 | A | * | 1/1999 | Miyasaka | ................... 438/149 |
| 6,043,427 | A | * | 3/2000 | Nishimoto | .................. 136/258 |
| 6,057,005 | A | * | 5/2000 | Nishimoto | .................. 427/578 |
| 6,100,466 | A | * | 8/2000 | Nishimoto | .................. 136/258 |
| 6,172,296 | B1 | * | 1/2001 | Iwasaki et al. | ............. 136/256 |
| 6,337,224 | B1 | | 1/2002 | Okamoto et al. | ............. 438/69 |

FOREIGN PATENT DOCUMENTS

| | | |
|---|---|---|
| JP | 57-187971 | 11/1982 |
| JP | 7-176496 | 7/1995 |
| JP | 2001-140077 | 5/2001 |

OTHER PUBLICATIONS

H. Keppner et al., "Scope of VHF Plasma Deposition for Thin–Film Silicon Solar Cells", 25$^{th}$ IEEE Photovoltaic Spec. Conf., Washington DC, pp. 669–672 (1996).

D. Fischer et al., "The 'Micromorph' Solar Cell: Extending A–Si:H Technology Towards Thin Film Crystalline Silicon", 25$^{th}$ IEEE Photovoltaic Spec. Conf., Washington DC, pp. 1053–1056 (1996).

C. Hof et al., "Long Term Behaviour of Passively Heated or Cooled A–Si:H Modules", 25$^{th}$ IEEE Photovoltaic Spec. Conf., Washington DC, pp. 1057–1060 (1996).

* cited by examiner

*Primary Examiner*—Alan Diamond
(74) *Attorney, Agent, or Firm*—Fitzpatrick, Cella, Harper & Scinto

(57) ABSTRACT

Disclosed herein is a method of forming a microcrystalline silicon film by using a raw gas containing at least a silicon compound by a high-frequency plasma CVD method, wherein the formation of the film is conducted in such a manner that the residence time, $\tau$ (ms) of the raw gas in a film deposition chamber, which is defined as $\tau$ (ms)=78.9× V×P/M, in which V is a volume (cm$^3$) of the deposition chamber, P is a deposition pressure (Torr), and M is a total flow rate (sccm) of the raw gas, satisfies $\tau$<40. The method permits the formation of a good-quality microcrystalline silicon film at low cost.

9 Claims, 13 Drawing Sheets

METHOD OF FORMING
MICROCRYSTALLINE SILICON FILM,
METHOD OF FABRICATING
PHOTOVOLTAIC CELL USING SAID
METHOD, AND PHOTOVOLTAIC DEVICE
FABRICATED THEREBY

BACKGROUND OF THE INVENTION

1. Field of the Invention

The present invention relates to a method of forming a microcrystalline silicon film, a method of fabricating a photovoltaic device using this method, and a photovoltaic device fabricated thereby, and particularly to a method of forming a microcrystalline silicon film using a plasma CVD method, a method of fabricating a photovoltaic device using this method, and a photovoltaic device fabricated thereby.

2. Related Background Art

Since the valence electron control of a thin amorphous silicon film became feasible in the latter half of 1970s, headway has come to be made in research and development for applying the thin amorphous silicon film to photovoltaic devices typified by a solar cell. As a process for fabricating a photovoltaic device having a thin amorphous silicon film or the like, there has heretofore been widely known a plasma CVD method utilizing radio frequency (RF) typified by 13.56 MHz.

According to the photovoltaic device having the thin amorphous silicon film or the like fabricated by the RF plasma CVD method, a comparatively good photoelectric conversion efficiency is achieved with a less material compared with bulk-monocrystalline or polycrystalline silicon. However, there is room for improvement in process speed. More specifically, the thickness of the amorphous silicon layer used in an active layer of the photovoltaic device is required to be about several thousands Å. In order to obtain a good-quality amorphous silicon layer suitable for use in the photovoltaic device, however, it must be deposited at an extremely low rate. It has thus been difficult to reduce process cost.

By the way, in the plasma CVD method using 13.56 MHz, it has been confirmed that the quality of a thin film formed tends to be more rapidly deteriorated as the deposition rate of the film is increased, and so it is difficult to enhance throughput upon mass production.

A plasma CVD method using a microwave (MW) typified by 2.45 GHz has also been known as a method capable of forming a comparatively good-quality thin film even when the deposition rate of the thin film is comparatively high. For example, "a-Si Solar Cell according to Microwave plasma CVD Method", Kazufumi Azuma, Takeshi Watanabe, and Toshikazu Shimada, Preprints in 50th Science Lecture Meeting of Applied Physics Society, pp. 566 is mentioned as an example where an i- type layer is formed by the microwave plasma CVD method.

It has also been known that the use of the frequency of about 100 MHz within the VHF band is effective from the viewpoints of the provision of a high-quality thin amorphous silicon film and the high-speed formation of the film. For example, U.S. Pat. No. 4,933,203 describes the fact that "a good-quality amorphous silicon film is obtained at a ratio, f/d of frequency, f (MHz) to an interelectrode distance, d (cm) of from 30 to 100 in a frequency range of from 25 to 150 MHz".

In this publication, the relationship between the frequency and the interelectrode distance is defined with respect to the production process of an amorphous silicon film. However, it describes neither the production process of a microcrystalline silicon film nor the deposition pressure and raw gas residence time in a frequency range higher than 150 MHz.

By the way, the thin film photovoltaic device using the thin amorphous silicon film generally has a pin junction structure, and the photoelectric conversion thereof is mainly conducted in an i-type layer. Many attempts to microcrystallize a p-type layer and/or an n- type layer in order to improve junction characteristics have been made to date. For example, Japanese Patent Application Laid-Open No. 57-187971 discloses a method of improving output current and output voltage by forming an i-type layer with amorphous silicon and forming at least a layer of a p-type layer and an n-type layer, which is situated on the side struck by light, with microcrystalline silicon having an average grain size of at most 100 Å.

However, at the present time, in any forming process, a phenomenon (the so-called Staebler-Wronski effect) that the defect density of an i-type layer is increased upon exposure to light to cause the reduction of photoelectric conversion efficiency has become a great problem in practical use in pin-type solar cells using amorphous silicon for the i-type layer.

In recent years, it has been attempted to use i-type microcrystalline silicon for a photoelectric conversion layer of an amorphous silicon type thin film photovoltaic device. For example, in 25th IEEE PV Specialists Conference, Washington, May 13–17, 1996, a group of Shah et al. in Neuchatel University has reported a pin-type microcrystalline silicon solar cell having a photoelectric conversion efficiency of 7.7% without being attended with deterioration by light, which was fabricated by using microcrystalline silicon for all the layers of a p-type layer, an i-type layer and an n-type layer.

A process for forming the microcrystalline silicon layers adopted by this group is basically the same as the constitution of the conventional RF plasma CVD method and does not use a high-temperature process above 500° C. required for the formation of a thin crystalline silicon film such as a thin polycrystalline silicon film. It is also characterized in that the frequency of 110 MHz within the VHF band is adopted as plasma forming frequency.

As described above, the pin-type solar cell using the i-type microcrystalline silicon film formed by using the frequency within the VHF band has a great advantage in that the solar cell is not attended with deterioration by light though it may be fabricated by a low-temperature process.

According to the above-described report from the group of Shah et al. in Neuchatel University, the deposition rate of the i-type layer of microcrystalline silicon was 1.2 Å/s, and the thickness thereof was 3.6 $\mu$m. It is found by a simple calculation that the time required to form the i-type layer of microcrystalline silicon is as long as at least 8 hours. Therefore, its throughput is very small though it has a comparatively high conversion efficiency and is not attended with deterioration by light. As a result, it is difficult for such a process to reduce its production cost.

In order to realize the mass production of the pin- type solar cell using microcrystalline silicon for an i- type layer, it is essential to enhance the deposition rate of the i-type layer of microcrystalline silicon by leaps and bounds. However, pin-type solar cells using the microcrystalline silicon for the i-type layer and having a comparatively good photoelectric conversion efficiency have been comparatively lately fabricated, and so the technique for forming the i-type microcrystalline silicon layer at a high speed has been scarcely known under the existing circumstances.

For example, when a high-temperature process above 500° C. is used, it is expected that energy for crystallization can be obtained as thermal energy from a substrate, and so the formation of a film at a high speed can be conducted with comparative ease. However, the use of the high-temperature process incurs a possibility that the deterioration of cell characteristics may occur due to mutual diffusion at a cell interface, and involves a problem that process cost is increased.

SUMMARY OF THE INVENTION

The present invention has been completed in view of the foregoing circumstances, and it is an object of the present invention to provide a method of forming a microcrystalline silicon film having excellent semiconductor characteristics.

Another object of the present invention is to provide a method of forming a microcrystalline silicon film, by which a microcrystalline silicon film having good characteristics can be formed even when the formation is conducted at a low temperature and a high deposition rate.

A further object of the present invention is to provide a method of forming a microcrystalline silicon film, by which a microcrystalline silicon film suitable for use in an i-type layer of a pin-type solar cell can be formed at a high rate of from 2 to several tens Å/s even by a low-temperature process of, for example, 150 to 500° C. without using the high-temperature process above 500° C.

A still further object of the present invention is to provide a method of fabricating a photovoltaic device using any one of the forming methods of a microcrystalline silicon film by which the above objects can be achieved, and a photovoltaic device having a microcrystalline silicon film obtained by such a forming method as a component.

A yet still further object of the present invention is to provide a method of forming a microcrystalline silicon film with a raw gas containing at least a silicon compound by a high-frequency plasma CVD method, wherein the formation of the film is conducted such that the residence time $\tau$ (ms) of the raw gas in a film deposition chamber, which is defined as $\tau$ (ms)=78.9×V×P/M in which V is a volume (cm$^3$) of the deposition chamber, P is a deposition pressure (Torr) and M is a total flow rate (sccm) of the raw gas, satisfies $\tau$<40.

A yet still further object of the present invention is to provide a method of fabricating a photovoltaic device utilizing the forming method described above, and a photovoltaic device having a microcrystalline silicon film obtained according to the above film forming method.

As described above, the present invention relates to novel methods of forming a microcrystalline silicon film, and photovoltaic devices having the microcrystalline silicon film formed by such a method as a photoelectric conversion layer. The constitution and action of the present invention will hereinafter be further described.

In the high-frequency plasma CVD method using a silicon compound such as silane as a raw gas, the crystallinity, defect density, photosensitivity and the like of a film deposited can be controlled by changing forming conditions (frequency of high frequency, high-frequency power, substrate temperature, deposition pressure, distance between a substrate and an electrode, flow rate of the raw gas, dilution rate of the raw gas, etc.).

As described above, the present inventor has gone ahead with the research and development of methods for forming a microcrystalline silicon film suitable for use in an i-type layer of a pin-type solar cell at a high rate of 2 to several tens Å/s even by a low-temperature process of 150 to 500° C.

As a result, it has been found that the range ($\tau$<40) of the residence time of the raw gas exists as forming conditions for forming a good-quality microcrystalline silicon film, particularly, in a high deposition rate region of at least 5 Å/s.

Here, the residence time, $\tau$ (ms) is defined in the following manner. Incidentally, deposition pressure, the total flow rate of the raw gas and the volume of a deposition chamber are regarded as P (Torr), M (sccm) and V (cm$^3$), respectively.

When $P_1$=760 (Torr), $V_1$=M/60 (cm$^3$/s), $P_2$=P (Torr), $V_2$=V (cm$^3$)/$\tau$ (ms)×103 are substituted into the relational expression (Boyle's law), $P_1V_1$=$P_2V_2$ between volume and pressure of a gas at the same temperature, $\tau$ (ms)=78.9×V×P/M is derived.

In general, the decomposition of the raw gas is accelerated, and at the same time energy of ions and electrons present in plasma is also increased as frequency, f is increased under conditions that the pressure, P is fixed. It is therefore considered that a film deposited can receive energy from the ions and electrons in the plasma, thereby accelerating lattice relaxation to improve crystallinity.

When the frequency, f is continuously increased while keeping the distance, d between the substrate and the electrode constant, however, the energy applied to the deposited film from the plasma becomes too great, so that the defect density in the deposited film is increased, and in some cases the deposited film itself may not be formed due to etching effect. Therefore, the value of the distance, d (cm) between the substrate and the electrode, at which a good-quality film can be formed, increases with the increase in the frequency, f.

In U.S. Pat. No. 4,933,203 described above, the condition range of the ratio, f/d of the frequency, f and the distance, d (cm) between the substrate and the electrode for forming a good-quality film is defined. However, U.S. Pat. No. 4,933,203 describes the optimum conditions for forming good-quality amorphous silicon films and alloy films thereof, but refers to neither the formation of a microcrystalline silicon film nor the residence time.

According to the results of the research and development performed by the present inventor, a good-quality microcrystalline silicon film was able to be formed in the frequency, f ranging from 50 to 550 MHz in the formation of the microcrystalline silicon film by the high-frequency plasma CVD method using a silicon compound such as silane as a raw gas at a low temperature of 500° C. or lower. However, the optimum conditions in the respective forming conditions thereof varied between the low-frequency side and the high-frequency side within the range of from 50 to 550 MHz.

It has however been found that when the relational expression, $\tau$ (ms)=78.9×V×P/M of the residence time is used, the range of the conditions for forming a good quality microcrystalline silicon film can be defined over substantially the whole region of from 50 to 550 MHz, and the range falls within the range of $\tau$<40. Incidentally, the residence time is desirably at least 0.5 ms. The reason for it is that if the residence time of the raw gas is too short, the application of energy to the raw gas is decreased to fail to sufficiently decompose the raw gas, so that the utilization efficiency of the raw gas is reduced to decrease the deposition rate of the film.

In order to obtain a good-quality microcrystalline silicon film at low cost, it may be preferred that the frequency of a high-frequency power source be 50 or more and does not exceed 550 MHz, the temperature of a substrate be 150° C. or more and does not exceed 500° C., the deposition pressure be 0.01 Torr or more and does not exceed 0.5 Torr, and the making power density of the high frequency be 0.001 or more and does not exceed 0.5 W/cm$^3$.

It may be more preferred that in the frequency of the high-frequency power source being 50 MHz or more and not exceeding 200 MHz, the temperature of a substrate be 150 or more and doesnot exceed 500° C., the deposition pressure be 0.1 Torr or more and does not exceed 0.5 Torr, and the making power density of the high frequency be 0.001 W/cm$^3$ or more and does not exceed 0.2 W/cm$^3$.

It may also be more preferred that in the frequency of the high-frequency power source being 200 MHz or more and not exceeding 550 MHz, the temperature of a substrate be 150° C. or more and does not exceed 500° C., the deposition pressure be 0.01 Torr or more and does not exceed 0.3 Torr, and the making power density of the high frequency be 0.01 W/cm$^3$ or more and does not exceed 0.5 W/cm$^3$.

Referring to the raw gas from the viewpoint of the formation of a good-quality film at a high speed, it may be preferred that the total flow rate of the raw gas comprising a silicon compound gas and a diluent gas be at least 500 sccm, and a ratio of the diluent gas to the silicon compound gas be at least 20.

In particular, it may be more preferred that the total flow rate of the raw gas be at least 1,000 sccm, and a ratio of the diluent gas to the silicon compound gas be at least 25. The ratio may be desirably at most 60. The reason for it is that in the case of dilution with $H_2$ gas, the amount of $H_2$ is increased, and so the quality of the film deposited may be deteriorated due to damage by etching effect, H ions and the like.

The methods of forming a crystalline silicon film according to the present invention feature that the characteristics of a film formed are scarcely deteriorated, particularly, even upon the formation of the film at a high deposition rate of at least 5 Å/s.

In particular, the formation of a film at a deposition rate of at least 10 Å/s is very preferred, because it is related to the great shortening of process time. The methods of forming a crystalline silicon film according to the present invention may provide films having characteristics comparable with those in a low deposition rate of about 1 to 2 Å/s even when they are formed at a considerably high deposition rate of at least 10 Å/s.

From the viewpoint of the enhancement of film quality of the resulting microcrystalline silicon film, it may also be preferred that a second high frequency, which does substantially not contribute to the decomposition of the raw gas, is superimposed on the plasma.

It may also be preferred that supply powers from first and second high-frequency power sources be controlled in such a manner that the self-bias voltages of the first and second high frequencies become respective fixed values, since the deposition rate and characteristic distribution of a film to be formed in the direction of its thickness can be improved.

According to the methods of forming a crystalline silicon film according to the present invention, as described above, good-quality microcrystalline silicon films may be formed at low cost and a high speed. The detailed forming mechanism of the microcrystalline silicon film is not known, but may be expected to be as follows.

In the range of the above-described forming conditions, 1) a film can be formed at a low temperature and a high speed, since the frequency range is higher than 13.56 MHz in the conventional RF plasma CVD method, and so the decomposition efficiency of the raw gas and the plasma electron temperature are high.

2) The amounts of radicals and ions arrived at the growth surface of a microcrystalline silicon film can be controlled by selecting the pressure, frequency, gas flow rate, supply power, etc., thereby changing the forming conditions to amorphous film forming conditions, microcrystalline film forming conditions or etching conditions.

In particular, it has been confirmed that when the microcrystalline film is formed in a high rate region of at least 5 Å/s, it is effective to limit the residence time, τ (ms) of a raw gas, which is defined as τ (ms)=78.9×V×P/M, in which V is a volume (cm$^3$) of a deposition chamber, P is a deposition pressure (Torr), and M is a total flow rate (sccm) of the raw gas (silicon compound gas and diluent gas), to the range of τ<40.

It is considered that since the supply of the raw gas is sufficiently conducted within the range of τ<40, the forming conditions become conditions under which ions and radicals accelerating crystal growth are moderately incident while sufficiently supplying film forming species without exhausting gas species. It is also considered that when such a comparatively high flow rate as the total flow rate of the raw gas amounts to at least 500 sccm is used, an effect to prevent the raw gas in a discharge space from being excessively decomposed is brought about.

As a result, it is possible to prevent a malignant precursor, which forms the main cause of deterioration in the film quality of a film deposited, from increasing. It is considered that the prevention of increase in the malignant precursor is extremely important to the formation of a good-quality microcrystalline film, in particular, at a high rate of at least 5 Å/s.

3) It is considered that when the ratio of the diluent gas to the silicon compound gas is controlled to at least 20, the effect of hydrogen abstraction in the film by a hydrogen radical is accelerated, whereby microcrystallization is accelerated.

4) The potential distribution of the plasma can be controlled by superimposing the second high frequency, which does substantially not contribute to the decomposition of the raw gas, on the plasma, whereby the ion species arrived at the growth surface of a film deposited can be changed to control the film quality of the deposited film.

5) Supply powers from the first and second high-frequency power sources are controlled in such a manner that the self-bias voltages of the first and second high frequencies become respective fixed values, whereby the power substantially applied to the plasma can be kept constant, and so the deposition rate and characteristic distribution of a film to be deposited in the direction of its thickness can be controlled with high precision.

A photovoltaic device having, as a photoelectric conversion layer, a microcrystalline silicon film formed by any one of the methods of forming a microcrystalline silicon film according to the present invention has a high conversion efficiency and high stability to light at low cost.

The photovoltaic device according to the present invention has excellent sensitivity to long wavelength and is hence suitable for use as a lower cell of a stacked type thin film photovoltaic device.

The photovoltaic device according to the present invention can be continuously formed on a substrate in the form of a band by a roll to roll system to reduce production cost to a great extent.

DESCRIPTION OF THE PREFERRED EMBODIMENTS

The methods of forming a microcrystalline silicon film, and photovoltaic devices according to embodiments of the present invention will hereinafter be described in detail. However, the present invention is not limited in any way by these embodiments.

The microcrystalline silicon films according to the present invention were separately formed on a 7059 glass substrate produced by Corning Co. to evaluate them as to crystallinity by the Raman scattering method and estimate their grain sizes by the X-ray diffractometry. Further, solar cells using a microcrystalline silicon layer for an i-type layer of a pin-type photovoltaic device were fabricated to evaluate them as to cell characteristics.

Figure 1:
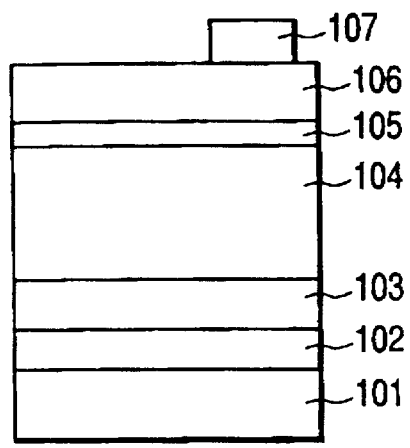
FIG. 1 is a schematic cross-sectional view illustrating an example of the construction of a photovoltaic device.

FIG. 1 schematically illustrates the construction of a photovoltaic device. The semiconductor layer thereof is of a pin type. In FIG. 1, the photovoltaic device according to the present invention comprises a substrate 101, a light-reflecting layer 102, an n-type layer 103, an i-type layer 104, a p-type layer 105, a transparent electrode layer 106 and a collecting electrode layer 107. The respective components will hereinafter be described.

[Substrate]

The substrate may be either one composed of a simple conductive material or another obtained by forming a conductive layer on a support composed of an insulating material or conductive material.

Examples of the conductive material include a copper plating plate, NiCr, stainless steel, metals such as Al, Cr, Mo, Au, Nb, Ta, V, Ti, Pt, Pb and Sn, and alloys thereof. In order to use one of these materials as a support, it is desirably in the form of a sheet, a roll with a continuous sheet rolled into a cylindrical shape, or a cylinder.

Examples of the insulating material include synthetic resins such as polyester, polyethylene, polycarbonate, cellulose acetate, polypropylene, polyvinyl chloride, polyvinylidene chloride, polystyrene and polyamide, glass, ceramics, and paper. In order to use one of these materials as a support, it is desirably in the form of a sheet, a roll with a continuous sheet rolled into a cylindrical shape, or a cylinder. In these insulating materials, a conductive layer is formed on at least one sides thereof to form the semiconductor layer according to the present invention on the surface of the conductive layer thus formed.

For example, in the case where the support is composed of glass, a conductive layer composed of a material such as NiCr, Al, Ag, Cr, Mo, Ir, Nb, Ta, V, Ti, Pt, Pb, $In_2O_3$, ITO or ZnO, or an alloy thereof is formed on the surface of the glass. When the support is a synthetic resin sheet such as a polyester film, a conductive layer composed of a material such as NiCr, Al, Cr, Ag, Pb, Mo, Au, Nb, Ta, V, Ti or Pt, or an alloy thereof is formed on the surface of the polyester film. In the case of a stainless steel sheet, a conductive layer composed of a material such as NiCr, Al, Ag, Cr, Mo, Ir, Nb, Ta, V, Ti, Pt, Pb, $In_2O_3$, ITO or ZnO, or an alloy thereof is formed on the surface of the stainless steel sheet.

Examples of a process for forming the conductive layer include vacuum deposition, sputtering and screen printing processes.

The surface profile of the support may be desirably smooth or irregular (textured) to the extent that the maximum height of crest is 0.1 to 1.0 μm. As a method for making the surface of, for example, a stainless steel substrate textured, may be mentioned an etching treatment of the substrate with an acid solution.

The thickness of the substrate is suitably determined so as to permit the fabrication of a photovoltaic device as desired. When the resulting photovoltaic device is required to have good flexibility, however, it is preferably as thin as possible so far as the function as the support is fully exhibited. However, the thickness is generally controlled to 10 μm from the viewpoints of the production, handling and mechanical strength of the support.

[Light-reflecting Layer]

As a desirable substrate mode in the photovoltaic device according to the present invention, is mentioned the formation of a conductive layer (light-reflecting layer) composed of a metal having high reflectivity against from visible rays to near infrared rays, such as Ag, Al, Cu, AlSi or CuMg, on the support. The light-reflecting layer is suitably formed by vacuum deposition, sputtering, electrodeposition from an aqueous solution, or the like. The layer thickness of the metal layer as the light-reflecting layer is suitably within a range of from 10 to 5,000 nm.

As a more desirable substrate mode in the photovoltaic device according to the present invention, is mentioned the formation of a transparent conductive layer composed of ZnO, $SnO_2$, $In_2O_3$, ITO, $TiO_2$, CdO, $Cd_2SnO_3$, $Bi_2O_3MoO_3$, $Na_xWO_3$ or the like on the light-reflecting layer. Examples of a suitable process for forming the transparent conductive layer include vacuum deposition, sputtering, electrodeposition, CVD, spraying, spin-on and dipping processes. The suitable layer thickness of the transparent conductive layer varies according to the refractive index of a layer to be formed, but is preferably within a range of from 50 nm to 10 $\mu$m.

In order to form a transparent conductive layer with a textured surface by, for example, a sputtering process, it is only necessary to control the forming temperature to at least 200° C. In any forming process, it is effective to etch the surface of the transparent conductive layer with a weak acid after the formation thereof in that the effect of the texturing is enhanced.

[Doped Layers (n-type Layer and p-type Layer)]

The base material of a doped layer is composed of an amorphous silicon or microcrystalline silicon semiconductor. Examples of the amorphous (hereinafter abbreviated as a-) silicon semiconductor include a-Si:H, a-SiC:H, a-SiO:H, a-SiN:H, a-SiCO:H, a-SiON:H, a-SiNC:H and a-SiCON:H. These semiconductors may contain fluorine.

Examples of the microcrystalline (hereinafter abbreviated as $\mu$c-) silicon semiconductor include $\mu$c-Si:H, $\mu$c-SiC:H, $\mu$c-SiO:H, $\mu$c-SiN:H, $\mu$c-SiCO:H, $\mu$c-SiON:H, $\mu$c-SiNC:H and $\mu$c-SiCON:H. The base material may be an amorphous silicon semiconductor containing microcrystalline silicon. These semiconductors may contain fluorine.

The amount of a valence electron controlling agent introduced for converting a conduction type into a p-type or n-type is preferably within a range of from 1,000 ppm to 10%.

Hydrogen (H or D) and fluorine play a role of compensating for dangling bond to enhance doping efficiency. The optimum content of hydrogen and fluorine is from 0.1 to 30 atom %. In particular, when the doped layer contains microcrystalline silicon, the optimum content is from 0.01 to 10 atom %.

The amount of carbon, oxygen and nitrogen atoms introduced is from 0.1 ppm to 20%. When they are introduced in a trace amount, the content is preferably within a range of from 0.1 ppm to 1%.

With respect to the electrical characteristics thereof, the doped layer preferably has an activation energy of 0.2 eV or lower and a specific resistance of 100 $\Omega$ cm or lower, most preferably 1 $\Omega$ cm or lower.

A deposition process of the p-type layer or n-type layer suitable for the photovoltaic device is RF plasma CVD, VHF plasma CVD or microwave plasma CVD method. In the case where the deposition of the p-type layer or n-type layer is conducted in accordance with, in particular, the RF plasma CVD method, it is preferred to control the temperature of the substrate in the deposition chamber within a range of from 100 to 500° C., the internal pressure within a range of from 0.1 to 10 Torr, the RF power within a range of from 0.05 to 1.0 W/cm$^3$, and the deposition rate within a range of from 0.01 to 3 nm/s.

Examples of a raw gas include silicon-containing compounds capable of being gasified, such as $SiH_4$, $Si_2H_6$, $SiF_4$, $SiFH_3$, $SiF_2H_2$, $SiF_3H$, $SiH_3D$, $SiFD_3$, $SiF_2D_2$, $SiD_3H$ and $Si_2D_3H_3$. Impurities for conducting valence electron control, for example, $B_2H_6$ and $BF_3$ for the n-type, or $PH_3$ for the p-type, may be added to the raw gas to use the mixture.

The compound capable of being gasified may also be diluted with a gas such as $H_2$, He, Ne, Ar, Xe and Kr before it is introduced into the deposition chamber. In particular, when a layer little in light absorption and wide in band gap, such as a microcrystalline semiconductor or a-SiC:H, is deposited, it is preferred that the raw gas be diluted with hydrogen gas to from ½ to ⅟100, and comparatively high power be applied as the RF power.

In the case of an RF plasma CVD method using RF of 0.1 GHz or lower, frequency of about 13.56 MHz is preferred. When the p-type layer or n-type layer is deposited by a high-frequency plasma CVD method using frequency higher than 0.1 GHz within a range from VHF to microwave, it is preferred that the substrate temperature in the deposition chamber be within a range of from 100 to 400° C., the internal pressure be within a range of 0.5 to 100 mTorr, and the high-frequency power be within a range of 0.01 to 1 W/cm$^3$.

[i-Type Layer]

In the photovoltaic device according to the present invention, the i-type layer is the most important layer which generates and transports a light-exited carrier. An i-type microcrystalline silicon film is used therefor.

In the present invention, the base material of the i-type layer is composed of a microcrystalline silicon semiconductor. Examples of the microcrystalline silicon semiconductor include $\mu$c-Si:H, $\mu$c-SiC:H, $\mu$c-SiO:H, $\mu$c-SiN:H, $\mu$c-SiCO:H, $\mu$c-SiON:H, $\mu$c-SiNC:H and $\mu$c-SiCON:H. These semiconductors may contain fluorine.

Hydrogen (H or D) and fluorine play a role of compensating for unbonded valence electrons. The optimum content of hydrogen and fluorine is from 0.1 to 30 atom %. In particular, when the doped layer contains microcrystalline silicon, the optimum content is from 0.01 to 10 atom %.

The amount of carbon, oxygen and nitrogen atoms introduced is from 0.1 ppm to 20%. When they are introduced in a trace amount, the content is preferably within a range of from 0.1 ppm to 1%.

A deposition process of the i-type layer suitable for the photovoltaic device is RF plasma CVD, VHF plasma CVD or microwave plasma CVD method. In the case where the deposition of the i-type layer is conducted in accordance with, in particular, the VHF plasma CVD method, it is preferred to control the substrate temperature in the deposition chamber within a range of from 150 to 400° C., the internal pressure within a range of from 0.01 to 0.5 Torr, the VHF power within a range of from 0.001 to 0.5 W/cm$^3$, and the deposition rate within a range of from 0.01 to 5 nm/s. Examples of a raw gas include silicon-containing compounds capable of being gasified, such as $SiH_4$, $Si_2H_6$, $SiF_4$, $SiFH_3$, $SiF_2H_2$, $SiF_3H$, $SiH_3D$, $SiFD_3$, $SiF_2D_2$, $SiD_3H$ and $Si_2D_3H_3$. The compound capable of being gasified may also be diluted with a gas such as $H_2$, He, Ne, Ar, Xe or Kr before it is introduced into the deposition chamber. In the formation of the microcrystalline semiconductor layer in particular, it is preferred that the raw gas be diluted with hydrogen gas to from ½ to ¹⁄₁₀₀, and comparatively high power be applied as the VHF power. By the way, when a fluorine-containing compound gas such as $SiF_4$ is used as the raw gas, there is brought about an effect that a good-quality microcrystalline semiconductor layer can be formed even when the rate of dilution with hydrogen is comparatively low.

In the present invention, the i-type microcrystalline silicon film is deposited by a high-frequency plasma CVD method by the forming process according to the present invention. Namely, in the high-frequency plasma CVD method, self-bias voltage generated in a high-frequency electrode is read, and a film is formed while controlling high-frequency supply power on the basis of the voltage value read. More specifically, the high-frequency supply power is controlled in such a manner that the self-bias voltage value read becomes constant.

In the method of forming the i-type microcrystalline silicon layer according to the present invention, preferred forming conditions are such that the frequency of a high-frequency power source is 50 MHz or more and does not exceed 550 MHz, the substrate temperature is 150° C. or more and does not exceed 500° C., the deposition pressure is 0.01 Torr or more and does not exceed 0.5 Torr, and the making power density of the high frequency is 0.001 W/cm³ or more and does not exceed 0.5 W/cm³.

It is more preferred to preset the substrate temperature within a range of 150 to 500° C., the deposition pressure within a range of from 0.1 to 0.5 Torr, and the making power density of the high frequency within a range of from 0.001 to 0.2 W/cm³ in the frequency of the high-frequency power source within the range of from 50 to 200 MHz, or to preset the substrate temperature within a range of from 150 to 500° C., the deposition pressure within a range of from 0.01 to 0.3 Torr, and the making power density of the high frequency within a range of from 0.01 to 0.5 W/cm³ in the frequency of the high-frequency power source within the range of from 200 to 550 MHz,.

It is also preferred that the total flow rate of the raw gas composed of a silicon compound gas and a diluent gas be at least 500 sccm, and a ratio of the diluent gas to the silicon compound gas be at least 20. It is more preferred that the total flow rate of the raw gas be at least 1,000 sccm, and the ratio of the diluent gas to the silicon compound gas be at least 25.

In the method of forming a crystalline silicon film according to the present invention, a good-quality microcrystalline silicon film having a grain size of 50 Å or greater can be formed at a high deposition rate of at least 2.0 Å/s, preferably at least 5.0 Å/s, more preferably 10.0 Å/s, so that the great shortening of process time is feasible.

In the present invention, it is also preferred that a second high-frequency electrode be further provided, and self-bias voltage generated in the second high-frequency electrode be read to control the value of high-frequency supply power on the basis of the voltage value read, specifically, in such a manner the self-bias voltage value becomes constant.

Figure 2:
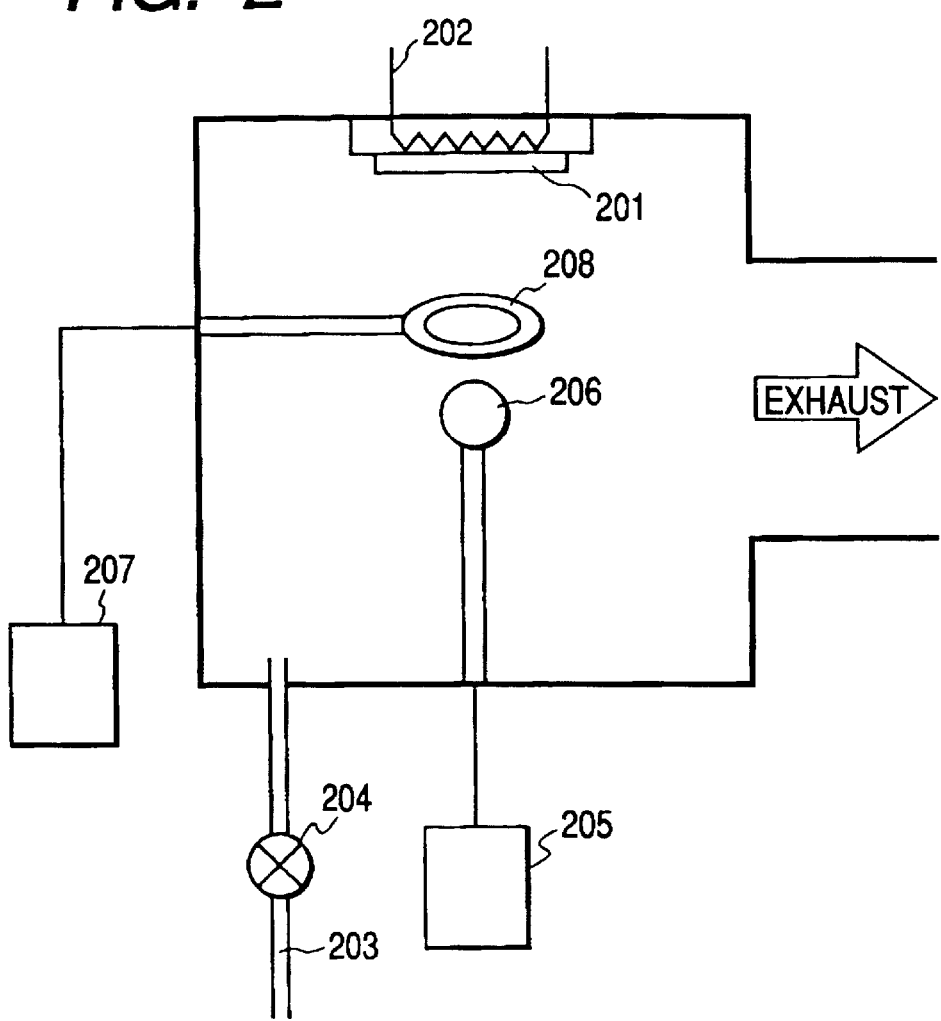
FIG. 2 schematically illustrates an example of the construction of a semiconductor film deposition apparatus.

FIG. 2 schematically illustrates an example of the construction of a semiconductor film deposition apparatus for performing the forming method of a microcrystalline silicon film according to the present invention. In FIG. 2, a substrate 201 is held on the inner upper wall of the deposition apparatus and heated to a desired temperature by a heater 202.

A raw gas is introduced into the interior of a deposition chamber through a gas inlet pipe 203 and a valve 204. As a source of plasma, power sources of respective frequency bands of VHF and RF are used either singly or in combination as needed.

Self-bias voltage generated in a VHF electrode 206 is read by a VHF reader 209, and the value read is sent to a VHF controller 210. The VHF controller 210 compares the self-bias voltage value read with a reference value inputted in advance to automatically change the supply power of a VHF power source (first high-frequency power source) 205 in such a manner that the self-bias voltage value becomes equal to the reference value.

Similarly, self-bias voltage generated in an RF electrode 208 is read by an RF reader 211, and the value read is sent to an RF controller 212. The RF controller 212 compares the self-bias voltage value read with a reference value inputted in advance to automatically change the supply power of an RF power source (second high-frequency power source) 207 in such a manner that the self-bias voltage value becomes equal to the reference value.

[Transparent Electrode Layer]

Indium oxide ($In_2O_3$), tin oxides [$SnO_2$, ITO ($In_2O_3$—$SnO_2$)] and the like are suitable for materials of a transparent electrode layer. Fluorine may be contained in these materials. The optimum deposition process of the transparent electrode layer is sputtering or vacuum deposition process.

In the case where the deposition is conducted by the sputtering process, a target such as a metal target or oxide target is used in suitable combination. In the case where the deposition is conducted by the sputtering process, the temperature of the substrate is an important factor, and its preferred range is from 20 to 600° C.

Examples of a gas for sputtering in the case where the transparent electrode layer is deposited by the sputtering process include inert gases such as Ar gas. It is also preferred that oxygen gas ($O_2$) be added to the inert gas as needed. In particular, in the case where a metal is used as a target, it is essential to add oxygen gas ($O_2$).

The pressure within a discharge space in the case where the target is sputtered with an inert gas or the like is preferably within a range of from 0.1 to 50 mTorr for effectively conducting the sputtering.

The deposition rate of the transparent electrode layer depends on the pressure within the discharge space and discharge pressure, but an optimum deposition rate is within a range of from 0.01 to 10 nm/s.

Deposition sources suitable for the deposition of the transparent electrode layer by the vacuum deposition process include metallic tin, metallic indium-tin, indium-tin alloys, etc.

The suitable temperature of the substrate in the case where the transparent electrode layer is deposited by the vacuum deposition process is within a range of from 25 to 600° C.

It is preferred to further introduce oxygen gas ($O_2$) to conduct the deposition in a pressure range of from $5\times10^{-5}$ to $9\times10^{-4}$ Torr. When the oxygen gas is introduced within this range, a metal evaporated from the deposition source reacts with the oxygen in a gas phase, thereby depositing a good-quality transparent electrode layer.

A preferred deposition rate of the transparent electrode layer under the above-described conditions is within range of from 0.01 to 10 nm/s. If the deposition rate is lower than 0.01 nm/s, the productivity of the electrode layer is lowered. If the deposition rate is higher than 10 nm/s on the other hand, the resulting layer becomes a coarse film. Such a coarse film is not preferred from the viewpoints of transmittance, conductivity and adhesion property.

The layer thickness of the transparent electrode layer is preferably such a thickness as satisfies the conditions as an anti-reflection film. A specific preferable layer thickness is within a range of from 50 to 500 nm.

[Collecting Electrode]

In order to cause light to strike the i-type layer as a photovoltaic layer as much as possible, and efficiently collect a carrier generated in an electrode, the form (form viewed from the incident direction of light) and material of a collecting electrode are important. In general, the collecting electrode is used in the form of a comb, and the line width (tooth width) and the number of lines thereof are determined by the form and size of the resulting photovoltaic device viewed from the incident direction of light, the material of the collecting electrode, and the like. The line width is generally of the order of from 0.1 to 5 mm.

As the material of the collecting electrode, there is used Fe, Cr, Ni, Au, Ti, Pd, Ag, Al, Cu, AlSi, C (graphite) or the like. In general, a metal having a low specific resistance, such as Ag, Cu, Al and Cr, and C, or an alloy thereof is suitable for the material.

The layer structure of the collecting electrode may be composed of either a single layer or plural layers.

These metals are preferably formed into collecting electrodes by a vacuum deposition, sputtering, plating or printing process. A suitable layer thickness thereof is within a range of from 10 nm to 0.5 mm.

In the case where the collecting electrode is formed by the vacuum deposition process, a mask in a form conforming to the collecting electrode is brought into close contact with the transparent electrode layer, and a metal is evaporated from a desired deposition source by electron beam or resistance heating in a vacuum to form the collecting electrode in the desired form on the transparent electrode.

In the case where the collecting electrode is formed by the sputtering process, a mask in a form conforming to the collecting electrode is brought into close contact with the transparent electrode layer, Ar gas is introduced into a vacuum, and direct current (DC) voltage is applied to a desired metal target for sputtering to generate glow discharge, thereby sputtering the metal to form the collecting electrode in the desired form on the transparent electrode.

In the case where the collecting electrode is formed by the printing process, the collecting electrode is formed by printing an electrode with Ag paste, Al paste or carbon paste by a screen printing machine.

The photovoltaic device of the pin structure has been described above. However, the present invention may also be applied to photovoltaic devices of pinpin and pinpinpin structures and the like with a plurality of semiconductor layers of the pin structure laminated on each other, photovoltaic devices of a nip structure, and photovoltaic devices of nipnip and nipnipnip structures and the like with a plurality of semiconductor layers of the nip structure laminated on each other.

The photovoltaic devices having a microcrystalline silicon layer formed by the forming method according to the present invention may also be suitably continuously fabricated by means of a continuous forming apparatus of a roll to roll system in which a sheet-like substrate is extended over between a pair of rolls to form a thin film while transferring the substrate. The continuous fabrication of the pin-type photovoltaic devices of the single pin structure using, as an i-type layer, the microcrystalline silicon film according to the present invention by means of the continuous forming apparatus of the roll to roll system is also preferred from the viewpoint that the number of deposition chambers can be decreased to reduce the cost of apparatus.

Since the photovoltaic devices according to the present invention are superior in photosensitivity in a long wavelength region to an amorphous silicon cell, an amorphous silicon cell can be laminated thereon, thereby enhancing the photoelectric conversion efficiency.

Figure 23:
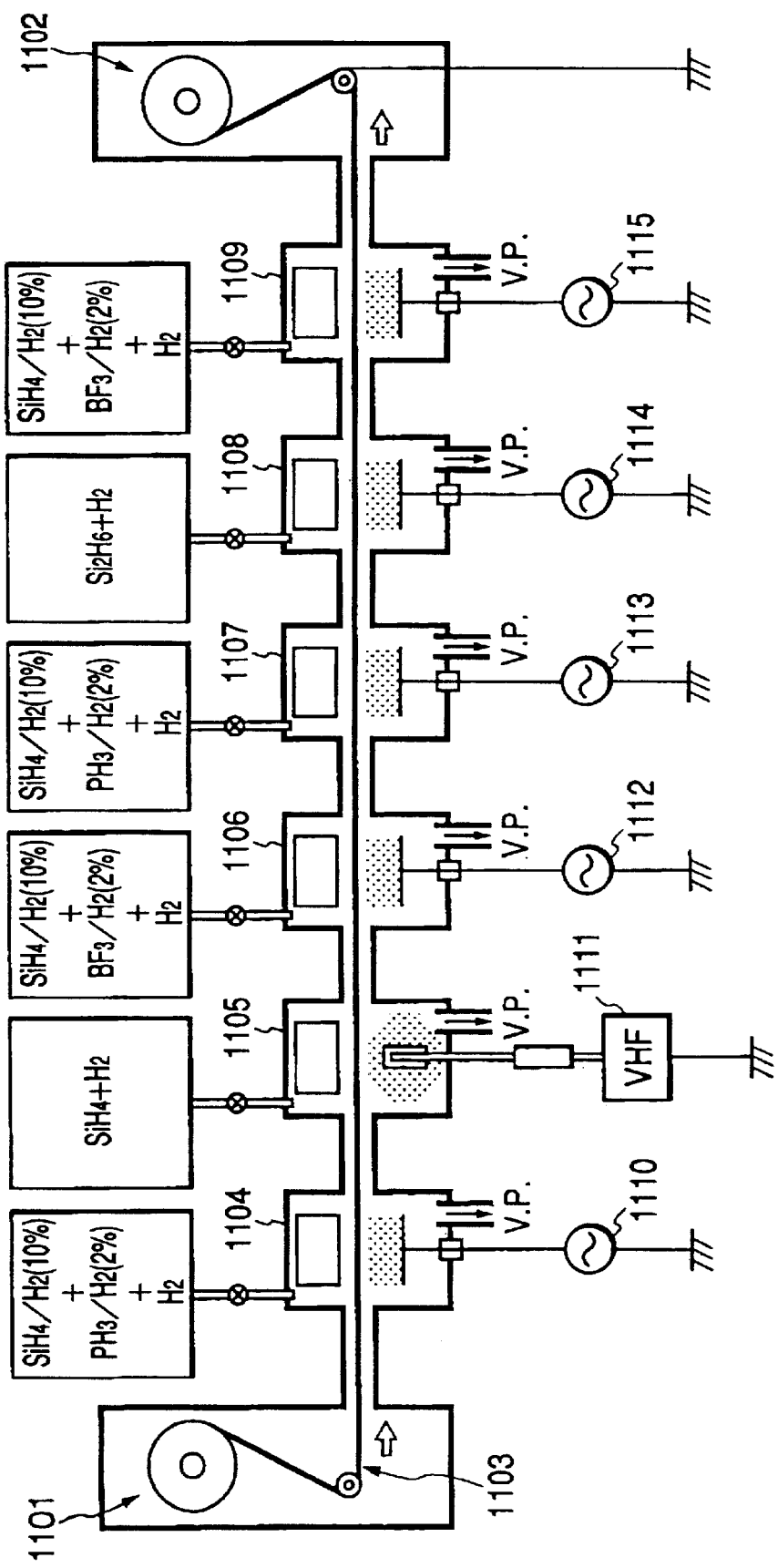
FIG. 23 schematically illustrates an example of the construction of a deposited film forming apparatus of a roll to roll system.

FIG. 23 schematically illustrates an example of the construction of a continuous forming apparatus of the roll to roll system for continuously laminating a cell having the i-type microcrystalline silicon film according to the present invention as a lower part on the conventional amorphous silicon cell as an upper part. A band-like substrate (web 1103) composed of a stainless steel sheet or the like is unrolled from a supply roll 1101, passes through deposition chambers 1104 to 1109 and then wound up on a wind-up roller 1102. Each outlet of the deposition chambers leads to a vacuum pump (V.P.).

In each of the deposition chambers 1104 and 1107, a raw gas composed of $SiH_4$, $PH_3$ and $H_2$ is used to form an n-type microcrystalline silicon film by the RF plasma CVD method.

In each of the deposition chambers 1106 and 1109, a raw gas composed of $SiH_4$, $BF_3$ and $H_2$ is used to form a p-type microcrystalline silicon film by the RF plasma CVD method.

In the deposition chambers 1105, a raw gas composed of $SiH_4$ and $H_2$ is used to form an i-type microcrystalline silicon film by the VHF plasma CVD method. In the deposition chambers 1108, a raw gas composed of $SiH_4$ and $H_2$ is used to form an i-type amorphous silicon film by the RF plasma CVD method.

The present invention will hereinafter be described in detail by the following Examples. However, the present invention is not limited to these examples only.

In the following Examples and Comparative Examples, the semiconductor film deposition apparatus illustrated in FIG. 2 was used for the deposition of i-type microcrystalline silicon films, and $SiH_4$ gas and $H_2$ gas both purified to ultra-high purity were used for a raw gas.

The substantial volume of a discharge space was about 3,000 $cm^3$, and the interior of the deposition chamber was evacuated to about $10^{-5}$ Torr by a turbo-molecular pump prior to the introduction of the raw gas to remove impurities.

Comparative Example 1-1

A microcrystalline silicon film having a thickness of about 1 μm was deposited on a 7059 glass substrate under the following conditions (frequency, f: 105 MHz; pressure, P: 0.3 Torr; residence time, τ: 114 ms; deposition rate: about 2 Å/s). Forming conditions of the i-type layer (frequency, f: 105 MHz; pressure, P: 0.3 Torr; residence time, τ: 114 ms):

Gas flow rate: $SiH_4$=20 sccm and $H_2$=600 sccm

Deposition temperature: 200° C.

VHF (105 MHz) power: 3 W

RF (13.56 MHz) power: not supplied

Deposition rate: about 2 Å/s.

Figure 3:
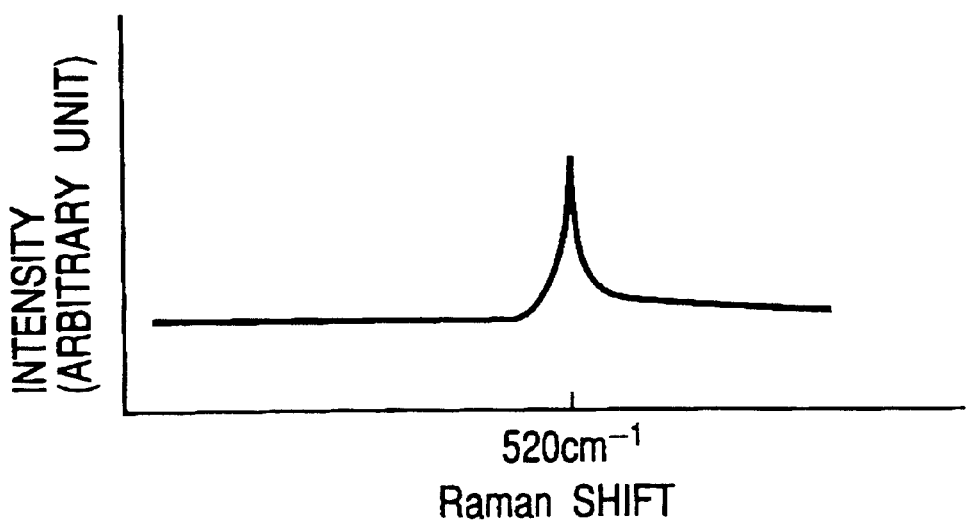
FIG. 3 diagrammatically illustrates an example of the Raman scattering characteristics of a deposited film.
Figure 4:
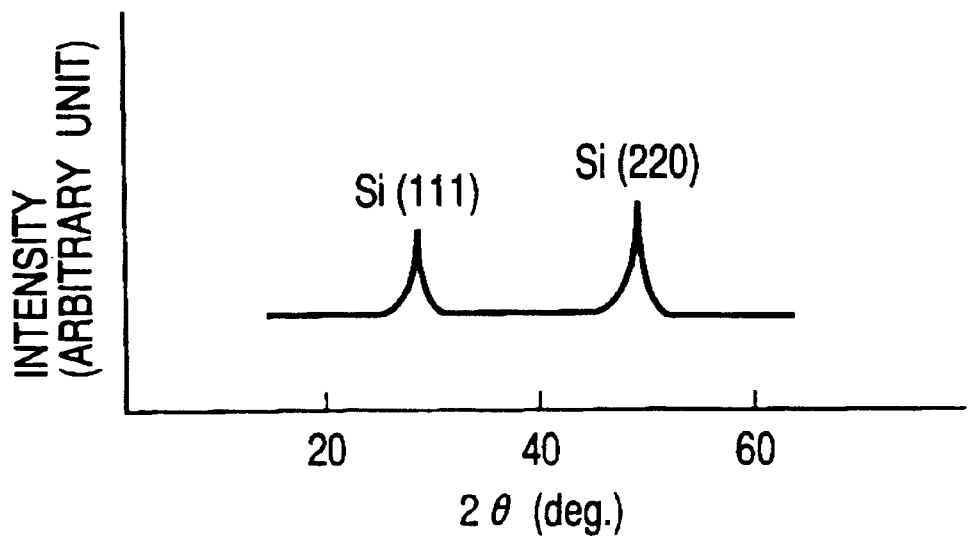
FIG. 4 diagrammatically illustrates an example of the X-ray diffraction characteristics of a deposited film.

The deposited film was evaluated by the Raman scattering method (FIG. 3) and the X-ray diffractometry (FIG. 4). As a result, a clear peak was observed at a Raman shift of about 520 $cm^{-1}$ as illustrated in FIG. 3, and so the deposited film was found to be crystallized.

As illustrated in FIG. 4, peaks of (111) orientation and (220) orientation were observed in the deposited film. The crystal grain size found by using the Scherrer's equation was about 400 Å as to the peak (220).

Example 1-1

A microcrystalline silicon film having a thickness of about 1 μm was deposited on a 7059 glass substrate under the following conditions (frequency, f: 105 MHz; pressure, P: 0.25 Torr; residence time, τ: 32 ms; deposition rate: about 7 Å/s). Forming conditions of the i-type layer (frequency, f: 105 MHz; pressure, P: 0.25 Torr; residence time, τ: 32 ms):

Gas flow rate: $SiH_4$=60 sccm, $H_2$=1,800 sccm

Deposition temperature: 250° C.

VHF (105 MHz) power: 150 W

RF (13.56 MHz) power: 10 W

Deposition rate: about 7.0 Å/s.

The deposited film was evaluated by the Raman scattering method and the X-ray diffractometry. As a result, the same results as in Comparative Example 1-1 were obtained, and so the deposited film was found to be crystallized. The crystal grain size found by using the Scherer's equation was about 250 Å as to the peak (220).

Example 1-2

A microcrystalline silicon film having a thickness of about 1 μm was deposited on a 7059 glass substrate under the following conditions (frequency, f: 500 MHz; pressure, P: 0.03 Torr; residence time, τ: 4.2 ms; deposition rate: about 15 Å/s). Forming conditions of the i-type layer (frequency, f: 500 MHz; pressure, P: 0.03 Torr; residence time, τ: 4.2 ms):

Gas flow rate: $SiH_4$=60 sccm, $H_2$=1,650 sccm

Deposition temperature: 350° C.

VHF (105 MHz) power: 400 W

RF (13.56 MHz) power: 20 W

Deposition rate: about 15 Å/S.

The deposited film was evaluated by the Raman scattering method and the X-ray diffractometry. As a result, the same results as in Comparative Example 1-1 were obtained, and so the deposited film was found to be crystallized. The crystal grain size found by using the Scherer's equation was about 150 Å as to the peak (220).

Comparative Example 1-2

Supply power was raised while retaining the residence time, τ of 114 ms in Comparative Example 1-1, thereby controlling the deposition rate to about 15 Å/s that was the same rate as in Example 1-2. As a result, Raman scattering characteristics and X-ray diffraction characteristics similar to FIG. 3 and FIG. 4, respectively, were obtained even in Comparative Example 1-2. In any case, however, peak intensity was low compared with Comparative Example 1-1.

The crystal grain size estimated from the X-ray diffractometry in Comparative Example 1-2 was about 60 Å that was considerably smaller than about 400 Å in Comparative Example 1-1.

Example 1-3

Supply power was raised while retaining the residence time, τ of 32 ms in Example 1-1, thereby controlling the deposition rate to about 15 Å/s that was the same rate as in Example 1-2. As a result, Raman scattering characteristics and X-ray diffraction characteristics similar to FIG. 3 and FIG. 4, respectively, were obtained even in Example 1-3. In any case, however, peak intensity was low compared with Example 1-1.

The crystal grain size estimated from the X-ray diffractometry in Example 1-3 was about 80 Å that was considerably smaller than about 250 Å in Example 1-1.

From the results of Comparative Examples 1-1 and 1-2 and Examples 1-1 to 1-3, it was confirmed that in a high deposition rate region of at least 5 Å/s, the limitation of the residence time, τ to the range of τ<40 is advantageous to the provision of a microcrystalline silicon film having a greater crystal grain size. In particular, these results suggest that when the deposition rate is as very high as at least 10 Å/s, the residence time of τ<30 is effective.

More specifically, it was confirmed that when a microcrystalline silicon film is formed in the high deposition rate region of at least 5 Å/s, to limit the residence time, τ (ms) of the raw gas in a film deposition chamber, which is defined as τ (ms)=78.9×V×P/M, in which V is a volume ($cm^3$) of the deposition chamber, P is a deposition pressure (Torr), and M is a total flow rate (sccm) of the raw gas (silicon compound gas and diluent gas), to the range of τ<40 is effective.

Example 2

In this example, a photovoltaic device of the construction illustrated in FIG. 1 was fabricated by means of the deposition apparatus illustrated in FIG. 2.

First of all, a substrate was prepared. A stainless steel sheet 0.5 mm in thickness and 50×50 $mm^2$ in area was immersed in a solution containing acetone and isopropyl alcohol to ultrasonically wash it, and then dried in hot air. An Ag film having a textured structure and a thickness of 0.8 μm was deposited on this stainless steel sheet at a deposition temperature of 300° C. using the DC magnetron sputtering process. Subsequently, a transparent conductive ZnO film having a textured structure and a thickness of 4.0 μm was deposited thereon at a deposition temperature of 300° C.

A pin semiconductor layer was formed on the transparent conductive ZnO film using deposition apparatus. The n-type layer was composed of hydrogen-containing microcrystalline silicon and deposited in a thickness of about 200 Å under the following conditions (deposition temperature: 230° C.) by the RF plasma CVD method using a deposition apparatus (not illustrated). Forming conditions of the n-type layer (n-type microcrystalline silicon; film thickness: 200 Å):

Gas flow rate: $SiH_4/H_2$ (10%)=4.0 sccm, $PH_3/H_2$ (2%)=1.0 sccm, $H_2$=100 sccm Deposition pressure: 1.0 Torr Deposition temperature: 230° C.

RF (13.56 MHz) power: 15 W

Deposition rate: 0.4 Å/s.

The i-type layer was composed of hydrogen-containing microcrystalline silicon and deposited in a thickness of about 1.0 μm at residence time, τ of 80 ms and deposition rate of about 2.0 Å/s using the deposition apparatus illustrated in FIG. 2.

The p-type layer was composed of hydrogen-containing microcrystalline silicon and deposited in a thickness of about 100 Å under the following conditions (deposition temperature: 170° C.) by the RF plasma CVD method using a deposition apparatus (not illustrated). Forming conditions of the p-type layer (p-type microcrystalline silicon; film thickness: 100 Å):

Gas flow rate: $SiH_4/H_2$ (10%)=1.0 sccm, $BF_3/H_2$ (2%)=0.2 sccm, $H_2$=35 sccm Deposition pressure: 2.0 Torr Deposition temperature: 170° C.

RF (13.56 MHz) power: 33 W

Deposition rate: 0.6 Å/s.

ITO was then deposited as a transparent electrode in a thickness of about 600 Å by a vacuum deposition process using resistance heating.

Further, Au was deposited as a collecting electrode in a thickness of about 8,000 Å by a vacuum deposition process using electron beam.

The pin-type photovoltaic device thus fabricated is hereinafter referred to as Cell 1.

The photoelectric conversion efficiency obtained in Cell 1 was used as a reference value to investigate the dependency of the conversion efficiency on the deposition rate. The residence time, τ was fixed to 80 ms, and the supply power and the like were changed to change the deposition rate.

Figure 5:
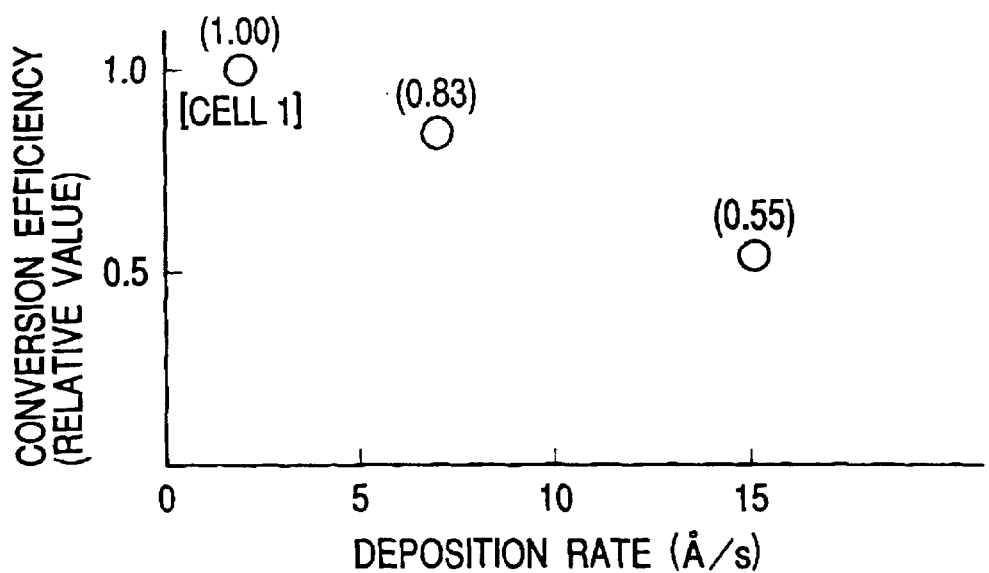
FIGS. 5, 6 and 7 diagrammatically illustrate examples of the relationship between the conversion efficiency of a photovoltaic device and the deposition rate of an i-type layer as against the prescribed residence time, τ of a raw gas.

As illustrated in FIG. 5, it is understood that in the residence time, τ of 80 ms, the conversion efficiency tends to greatly lower as the deposition rate is increased. Cells fabricated at deposition rates of about 7 Å/s and about 15 Å/s were observed lowering the efficiency by 17% and 45%, respectively, compared with Cell 1 fabricated at a deposition rate of about 2 Å/s.

The residence time, τ was then fixed to 40 ms, and the supply power and the like were changed to change the deposition rate. A cell fabricated in the residence time, τ of 40 ms at a deposition rate of about 2 Å/s is referred to as Cell 2. The photoelectric conversion efficiency obtained in Cell 2 was used as a reference value to investigate the dependency of the conversion efficiency on the deposition rate.

Figure 6:
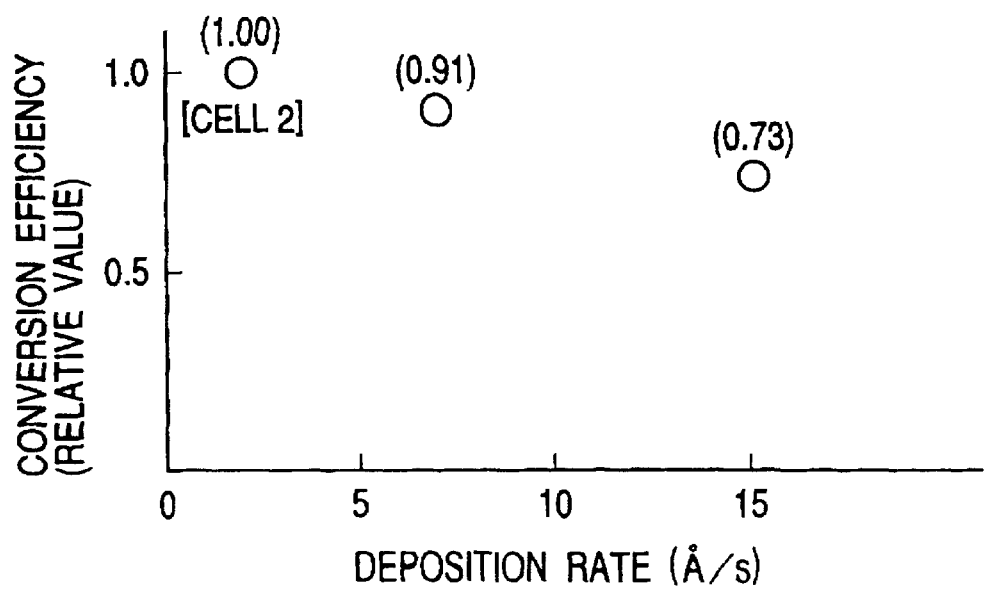

As illustrated in FIG. 6, it is understood that in the residence time, τ of 40 ms, the conversion efficiency also tends to lower as the deposition rate is increased. However, the proportion of the lowering of conversion efficiency to the increase in the deposition rate is lightened. Cells fabricated at deposition rates of about 7 Å/s and about 15 Å/s were observed lowering the efficiency by 9% and 27%, respectively, compared with Cell 2 fabricated at a deposition rate of about 2 Å/s. However, the lowering of efficiency is reduced compared with the case of the residence time, τ of 80 ms.

Further, the residence time, τ was fixed to 15 ms, and the supply power and the like were changed to change the deposition rate. A cell fabricated in the residence time, τ of 15 ms at a deposition rate of about 2 Å/s is referred to as Cell 3. The photoelectric conversion efficiency obtained in Cell 3 was used as a reference value to investigate the dependency of the conversion efficiency on the deposition rate.

Figure 7:
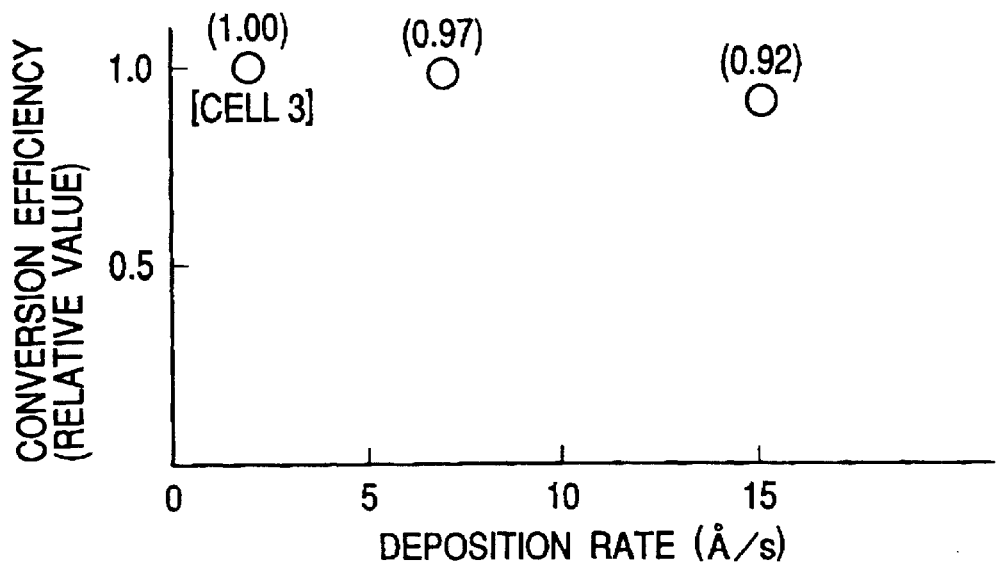

As illustrated in FIG. 7, it is understood that in the residence time, τ of 15 ms, the conversion efficiency also tends to lower as the deposition rate is increased. However, the proportion of the lowering of conversion efficiency to the increase in the deposition rate is greatly lightened. The conversion efficiency of a cell fabricated at a deposition rate of about 7 Å/s was lowered by only 3% compared with Cell 3 fabricated at a deposition rate of about 2 Å/s. Even in a cell fabricated at a deposition rate of about 15 Å/s, the lowering of efficiency was only 8%. The lowering of efficiency is more reduced compared with the case of the residence time, τ of 40 ms.

Example 3

The deposition rate (D.R.) was fixed to about 2 Å/s, and the gas flow rate and the like were changed to change the residence time, τ. A cell fabricated in the residence time, τ of 80 ms is referred to as Cell 4. The photoelectric conversion efficiency obtained in Cell 4 was used as a reference value to investigate the dependency of the conversion efficiency on the residence time.

Figure 8:
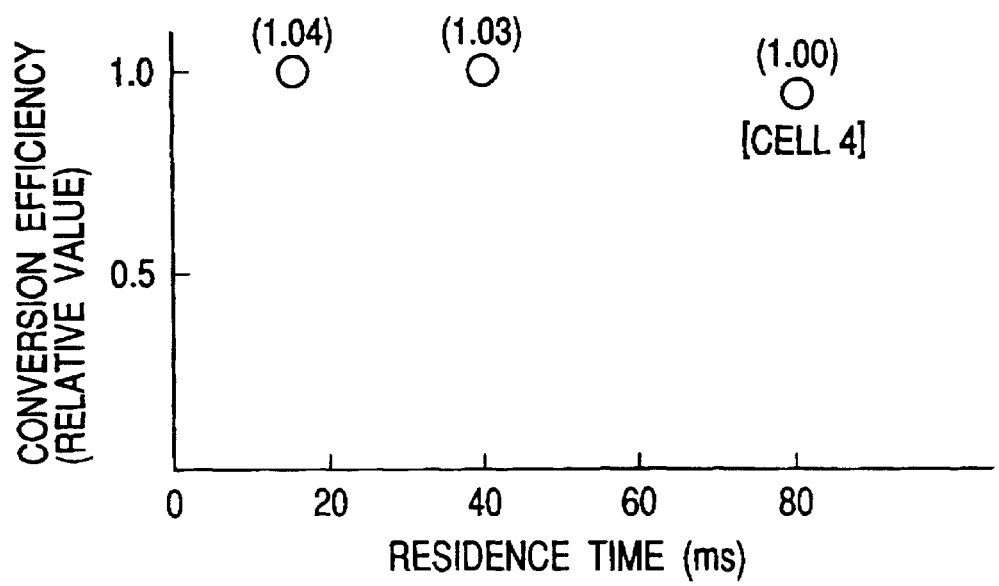
FIGS. 8, 9 and 10 diagrammatically illustrate examples of the relationship between the conversion efficiency of a photovoltaic device and the residence time, τ of a raw gas as against the prescribed deposition rate.

As illustrated in FIG. 8, it is understood that in D.R. of about 2 Å/s, the conversion efficiency tends to slightly improve as the residence time, τ is shortened. Cells fabricated in τ of 40 ms and τ of 15 ms were observed enhancing the efficiency by 3% and 4%, respectively, compared with Cell 4 fabricated in τ of 80 ms.

D.R. was then fixed to about 7 Å/s, and the gas flow rate and the like were changed to change the residence time, τ. A cell fabricated in the residence time, τ of 80 ms is referred to as Cell 5. The photoelectric conversion efficiency obtained in Cell 5 was used as a reference value to investigate the dependency of the conversion efficiency on the residence time.

Figure 9:
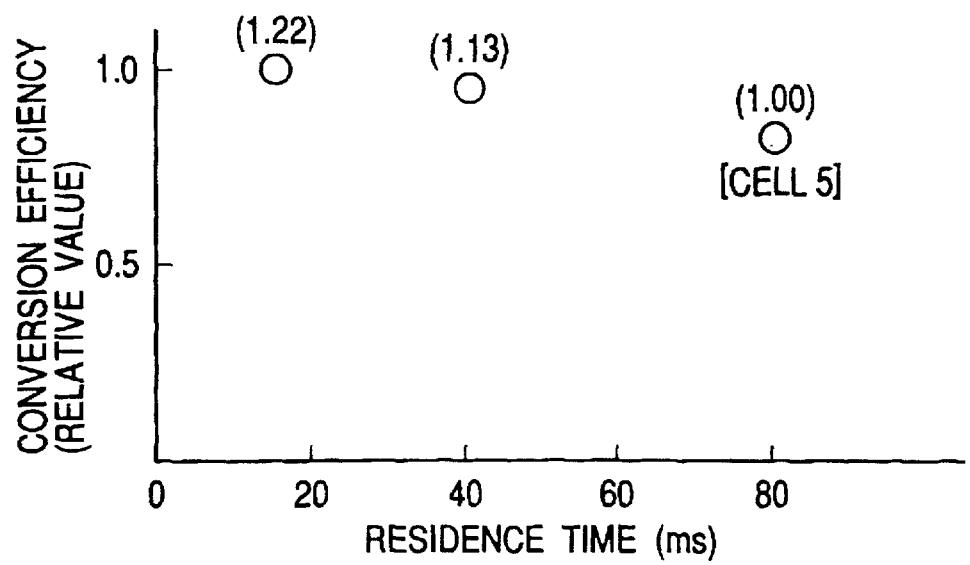

As illustrated in FIG. 9, it is understood that in D.R. of about 7 Å/s, the conversion efficiency also tends to improve as the residence time, τ is shortened. Cells fabricated in τ of 40 ms and τ of 15 ms were observed enhancing the efficiency by 13% and 22%, respectively, compared with Cell 5 fabricated in τ of 80 ms.

Further, D.R. was fixed to about 15 Å/s, and the gas flow rate and the like were changed to change the residence time, τ. A cell fabricated in the residence time, τ of 80 ms is referred to as Cell 6. The photoelectric conversion efficiency obtained in Cell 6 was used as a reference value to investigate the dependency of the conversion efficiency on the residence time.

Figure 10:
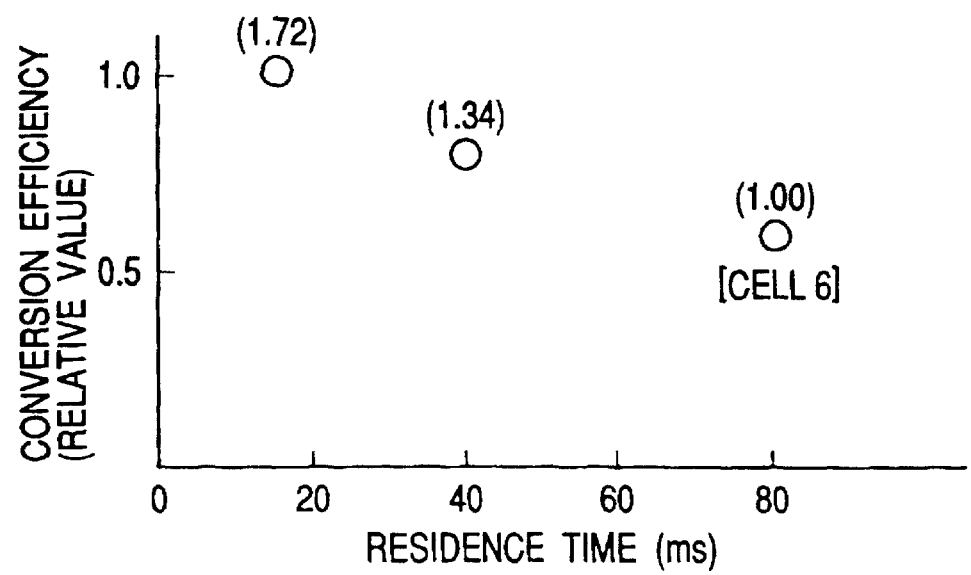

As illustrated in FIG. 10, it is understood that in D.R. of about 15 Å/s, the conversion efficiency tends to greatly improve as the residence time, τ is shortened. Cells fabricated in τ of 40 ms and τ of 15 ms were observed enhancing the efficiency by as much as 34% and 72%, respectively, compared with Cell 6 fabricated in τ of 80 ms.

Example 4

The deposition rate (D.R.) was fixed to about 2 Å/s, and the total gas flow rate (M) was changed under conditions that the residence time, τ was limited to a certain value. A cell fabricated at M of 500 sccm is referred to as Cell 7. The photoelectric conversion efficiency obtained in Cell 7 was used as a reference value to investigate the dependency of the conversion efficiency on the total gas flow rate.

Figure 11:
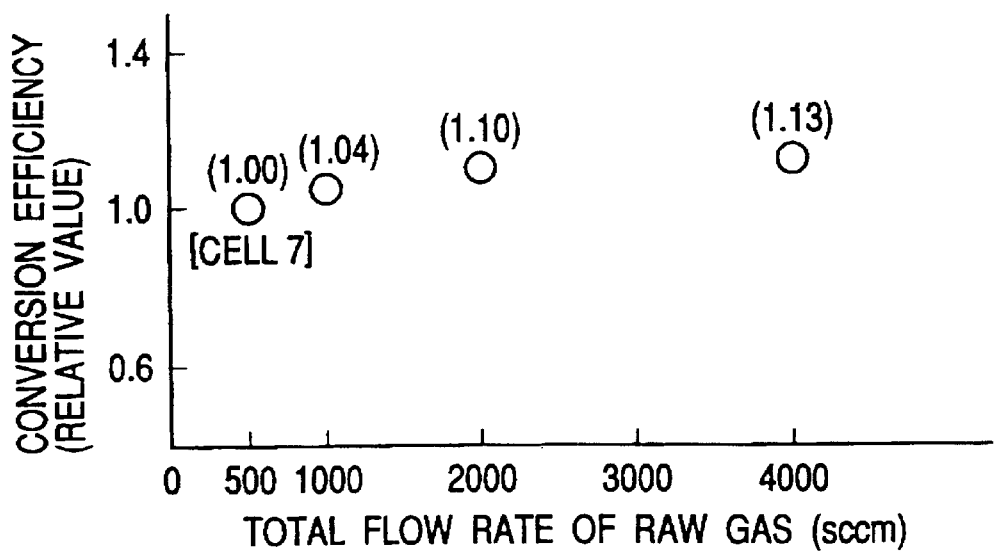
FIGS. 11, 12 and 13 diagrammatically illustrate examples of the relationship between the conversion efficiency of a photovoltaic device and the total flow rate of a raw gas as against the prescribed deposition rate.

As illustrated in FIG. 11, it is understood that in D.R. of about 2 Å/s, the conversion efficiency tends to slightly improve as the total gas flow rate is increased. A cell fabricated at M of 4,000 sccm was observed enhancing the efficiency by 13% compared with Cell 7 fabricated in M of 500 sccm.

D.R. was then fixed to about 7 Å/s, and the total gas flow rate (M) was changed under conditions that the residence time, τ was limited to a certain value. A cell fabricated at M of 500 sccm is referred to as Cell 8. The photoelectric conversion efficiency obtained in Cell 8 was used as a reference value to investigate the dependency of the conversion efficiency on the total gas flow rate.

Figure 12:
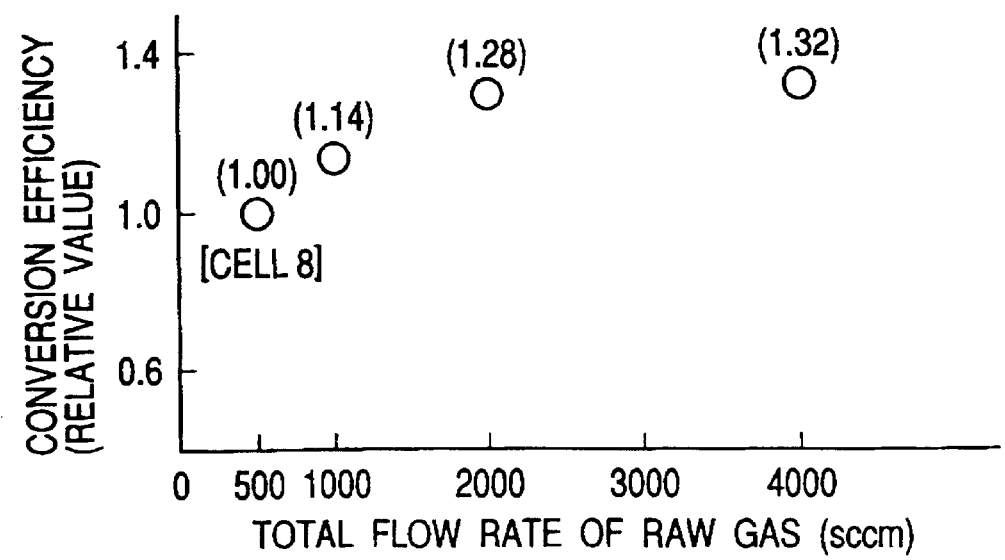

As illustrated in FIG. 12, it is understood that in D.R. of about 7 Å/s, the conversion efficiency also tends to improve as the total gas flow rate is increased. A cell fabricated at M of 4,000 sccm was observed enhancing the efficiency by 32% compared with Cell 8 fabricated in M of 500 sccm.

Further, D.R. was fixed to about 15 Å/s, and the total gas flow rate (M) was changed under conditions that the residence time, τ was limited to a certain value. A cell fabricated at M of 500 sccm is referred to as Cell 9. The photoelectric conversion efficiency obtained in Cell 9 was used as a reference value to investigate the dependency of the conversion efficiency on the total gas flow rate.

Figure 13:
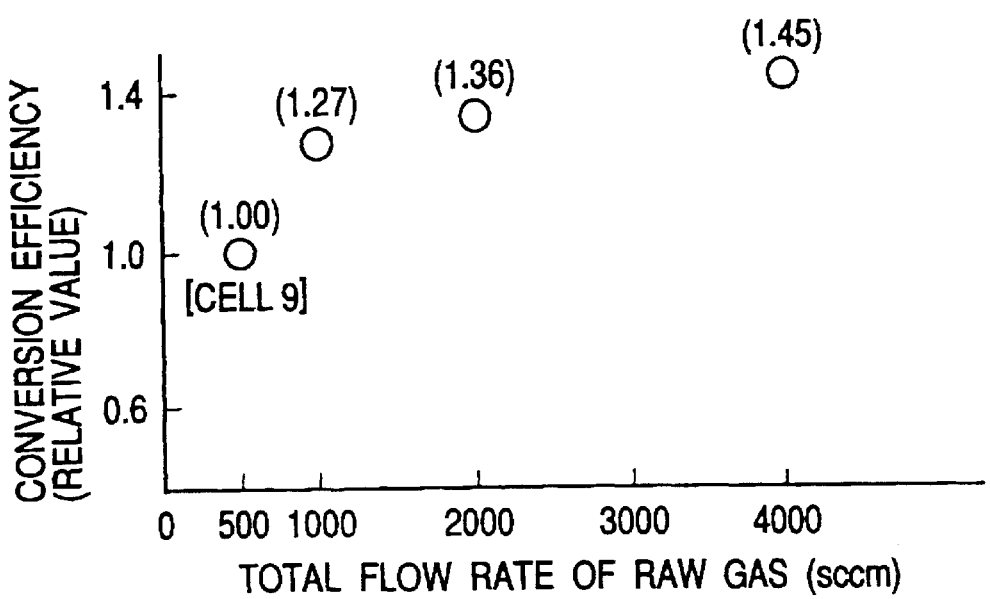

As illustrated in FIG. 13, it is understood that in D.R. of about 15 Å/s, the conversion efficiency tends to greatly improve as the total gas flow rate is increased. A cell fabricated at M of 4,000 sccm was observed enhancing the efficiency by as much as 45% compared with Cell 9 fabricated in M of 500 sccm.

Example 5

The deposition rate (D.R.) was fixed to about 2 Å/s, and the dilution rate (flow rate of a diluent gas/flow rate of silicon-containing gas) was changed under conditions that the residence time, τ was limited to a certain value. A cell fabricated at a dilution rate of 20 times is referred to as Cell 10. The photoelectric conversion efficiency obtained in Cell 10 was used as a reference value to investigate the dependency of the conversion efficiency on the dilution rate.

Figure 14:
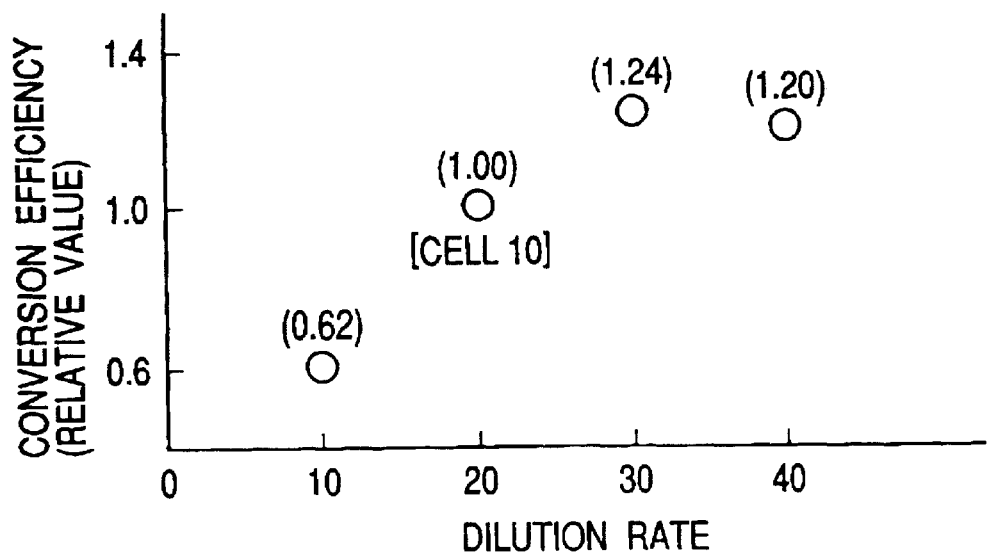
FIGS. 14, 15 and 16 diagrammatically illustrate examples of the relationship between the conversion efficiency of a photovoltaic device and the dilution rate of a raw gas as against the prescribed deposition rate.

As illustrated in FIG. 14, it is understood that in D.R. of about 2 Å/s, the conversion efficiency tends to improve as the dilution rate is increased, and in particular, a good efficiency is achieved at a dilution rate >20 times. Cells fabricated at dilution rates of 30 times and 40 times were observed enhancing the efficiency by 24% and 20%, respectively, compared with Cell 10 fabricated at a dilution rate of 20 times.

D.R. was then fixed to about 7 Å/s, and the dilution rate (flow rate of a diluent gas/flow rate of silicon-containing gas) was changed under conditions that the residence time, τ was limited to a certain value. A cell fabricated at a dilution rate of 20 times is referred to as Cell 11. The photoelectric conversion efficiency obtained in Cell 11 was used as a reference value to investigate the dependency of the conversion efficiency on the dilution rate.

Figure 15:
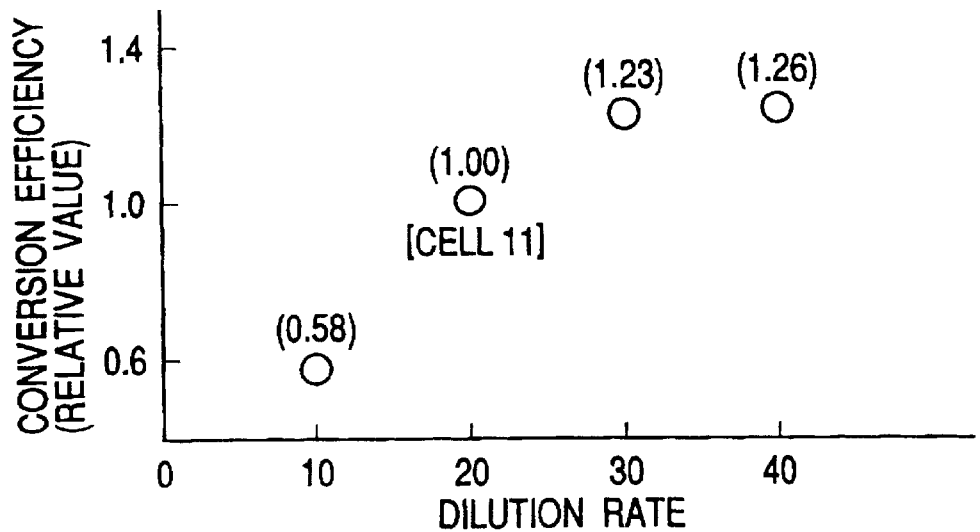

As illustrated in FIG. 15, it is understood that in D.R. of about 7 Å/s, the conversion efficiency also tends to improve as the dilution rate is increased, and in particular, a good efficiency is achieved at a dilution rate >20 times. Cells fabricated at dilution rates of 30 times and 40 times were observed enhancing the efficiency by 23% and 26%, respectively, compared with Cell 11 fabricated at a dilution rate of 20 times. In the range of higher dilution rates (>30), the proportion of improvement in efficiency is increased in the case of D.R.=about 7 Å/s compared with the case of D.R.=about 2 Å/s.

Further, D.R. was fixed to about 15 Å/s, and the dilution rate (flow rate of a diluent gas/flow rate of silicon-containing gas) was changed under conditions that the residence time, τ was limited to a certain value. A cell fabricated at a dilution rate of 20 times is referred to as Cell 12. The photoelectric conversion efficiency obtained in Cell 12 was used as a reference value to investigate the dependency of the conversion efficiency on the dilution rate.

Figure 16:
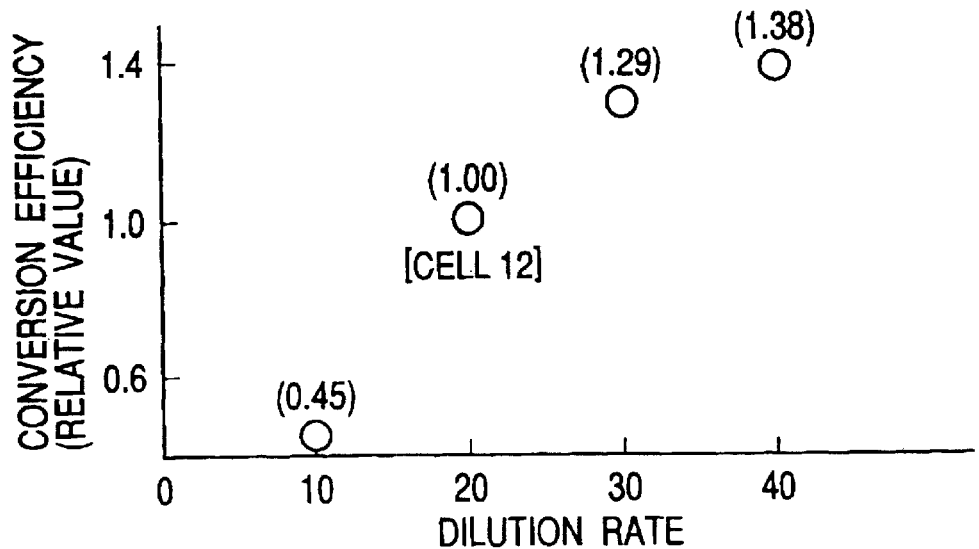

As illustrated in FIG. 16, it is understood that in D.R. of about 15 Å/s, the conversion efficiency also tends to improve as the dilution rate is increased, and in particular, a good efficiency is achieved at a dilution rate >20 times. Cells fabricated at dilution rates of 30 times and 40 times were observed enhancing the efficiency by 29% and 38%, respectively, compared with Cell 12 fabricated at a dilution rate of 20 times. In the range of higher dilution rates (>30), the proportion of improvement in efficiency is increased in the case of D.R.=about 15 Å/s compared with the case of D.R.=about 2 Å/s.

Example 6

Cases where RF bias voltage of so low power that does substantially not contribute to the decomposition of a raw gas was applied and not applied were compared with each other as to 3 cases of deposition rates (D.R.) of about 2 Å/s, about 7 Å/s and about 15 Å/s.

Figure 17:
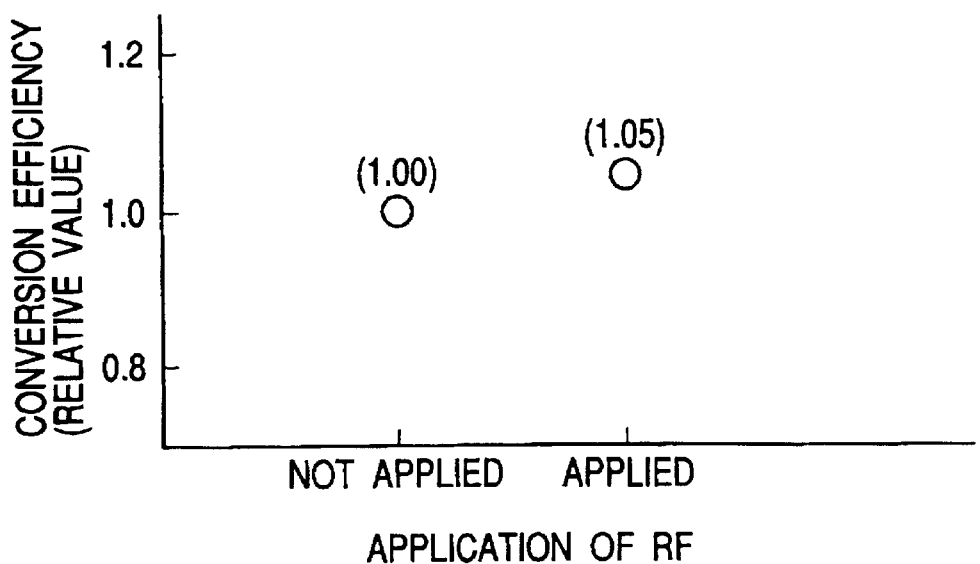
FIGS. 17, 18 and 19 diagrammatically illustrate examples of the relationship between the conversion efficiency of a photovoltaic device and the application of RF as against the prescribed deposition rate.
Figure 18:
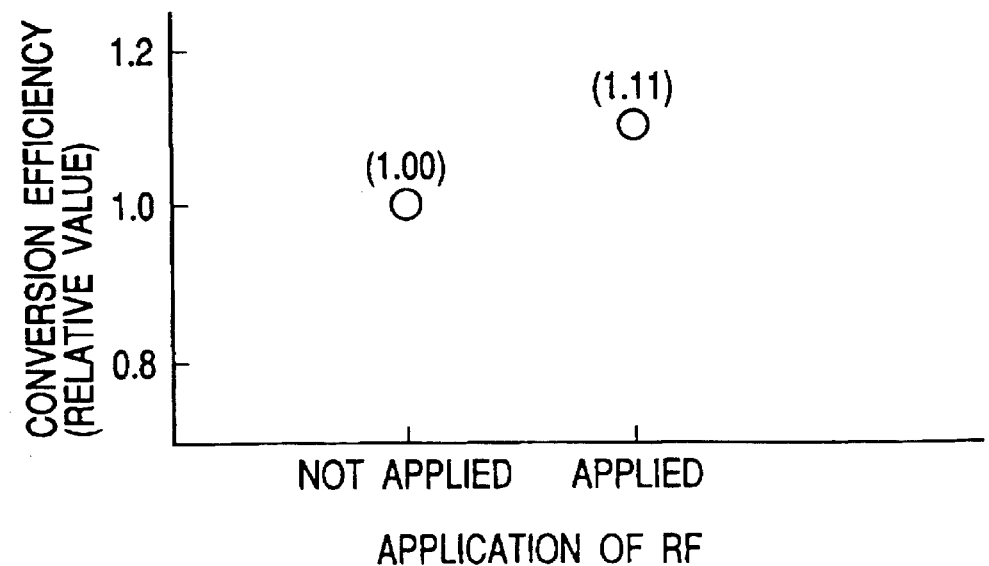
Figure 19:
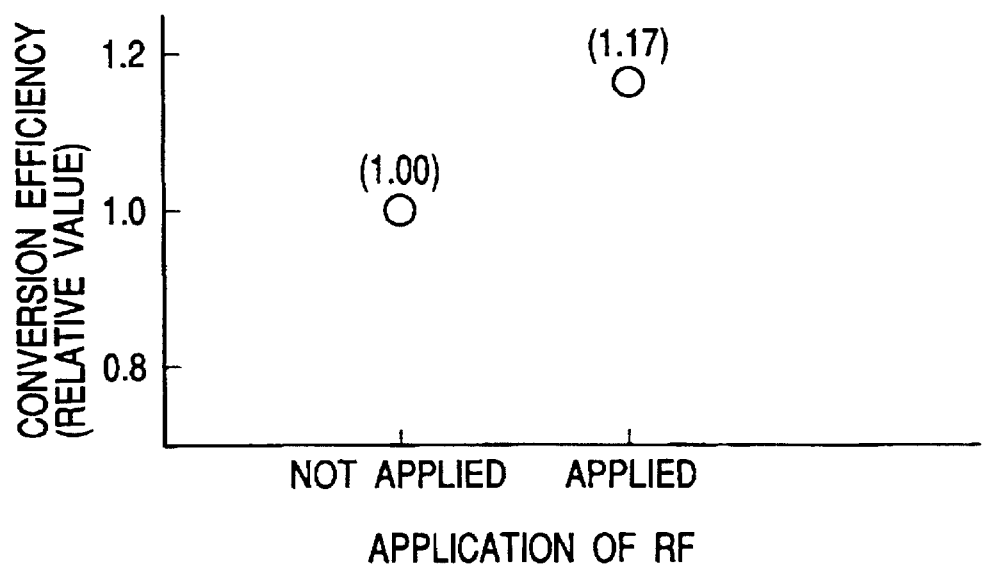

FIGS. 17 to 19 diagrammatically illustrate the results thereof. In any case, the characteristics of the resulting photovoltaic device were able to be improved by the application of RF. In particular, it is understood that when the value of D.R. is great, the proportion of improvement in characteristics is increased.

Example 7

In general, a film is deposited even on the surface of an electrode upon the formation of a film in a plasma CVD method using the electrode. Accordingly, even if the supply power of a high-frequency power source is kept constant, the effective supply power to the plasma may be lowered in some cases due to the deposited film on the surface of the electrode.

Figure 20:
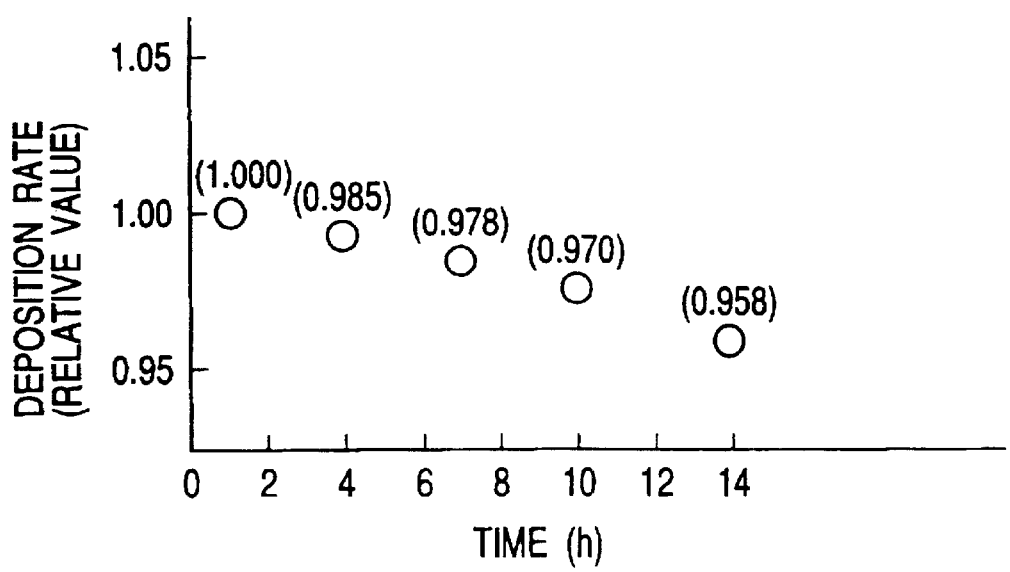
FIG. 20 diagrammatically illustrates an example of the relationship between the deposition rate of a film and elapsed time in the case where high-frequency supply power is kept constant.

As illustrated in FIG. 20, the lowering of the deposition rate was observed with the passage of the time even in the forming method of the present invention even when the formation of a film was conducted with the supply power kept constant. When the microcrystalline film formed by the forming method of the present invention is used as an i-type layer of a pin-type photovoltaic device, there are cases where one wants to keep the deposition rate and the quality of the film constant in the direction of its thickness. In such a case, as illustrated in FIG. 20, it is unsuitable to keep the supply power of the high-frequency power source constant.

The present inventor has carried out an extensive investigation. As a result, it has been found that in order to control the deposition rate and quality of a deposited film in the direction of its thickness, the value of self-bias voltage generated in a making high-frequency electrode becomes a good parameter.

Figure 21:
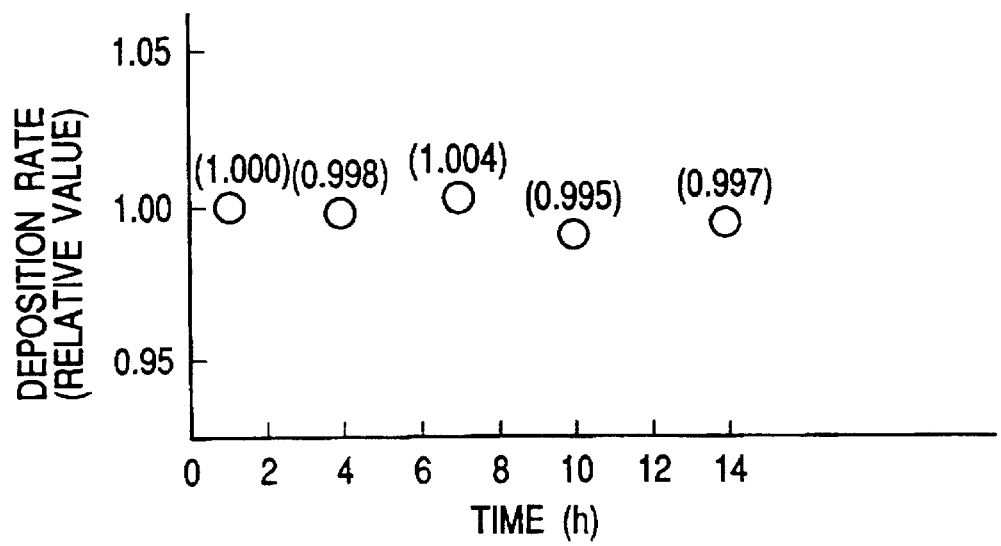
FIG. 21 diagrammatically illustrates an example of the relationship between the deposition rate of a film and elapsed time in the case where self-bias voltage is kept constant.

When the supply power is changed in such a manner that the self-bias voltage value always becomes a fixed value, it was possible to keep the deposition rate constant over a long period of time as illustrated in FIG. 21. The uniformity of the quality distribution of a deposited film in the direction of its thickness was is also improved.

It goes without saying that there are also cases where it is better to intentionally change the quality distribution of an i-type layer in the direction of its thickness in order to improve performance as a pin-type photovoltaic device. Even in such a case, the film formation according to the control of the self-bias voltage value is very preferred in that the precision of film quality control can be enhanced.

Figure 22:
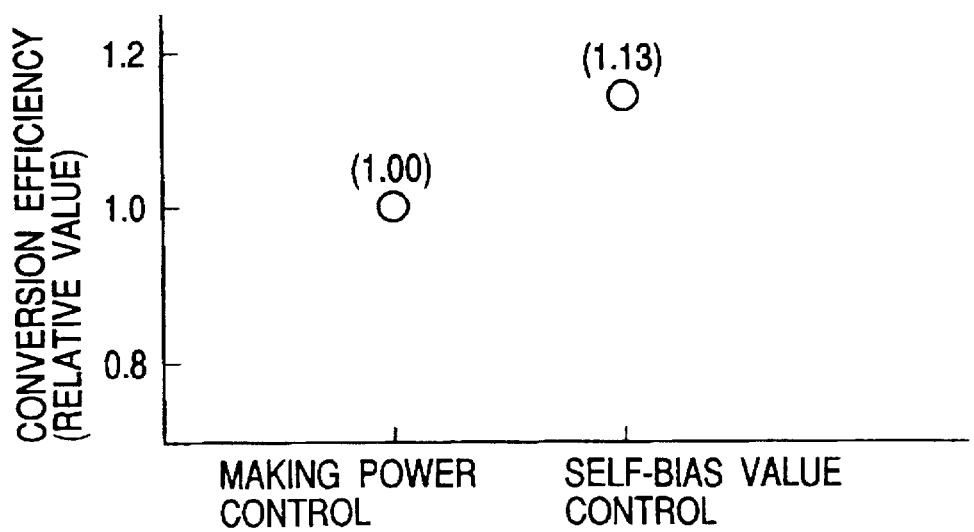
FIG. 22 diagrammatically illustrates examples of the conversion efficiencies of photovoltaic devices fabricated by controlling high-frequency supply power and self-bias voltage, respectively.

As illustrated in FIG. 22, a photovoltaic device fabricated according to the control of the self-bias voltage value has excellent characteristics compared with that according to the control of the supply power.

Example 8

As a comparative example, a double cell was fabricated by using an apparatus similar to the apparatus illustrated in FIG. 23 to continuously laminate an amorphous silicon germanium cell as a lower part on an amorphous silicon cell as an upper part. This double cell is referred to as Cell 13.

As an example, another double cell was fabricated by using the apparatus illustrated in FIG. 23 to continuously laminate a microcrystalline silicon cell as a lower part on an amorphous silicon cell as an upper part. This double cell is referred to as Cell 14.

Figure 24:
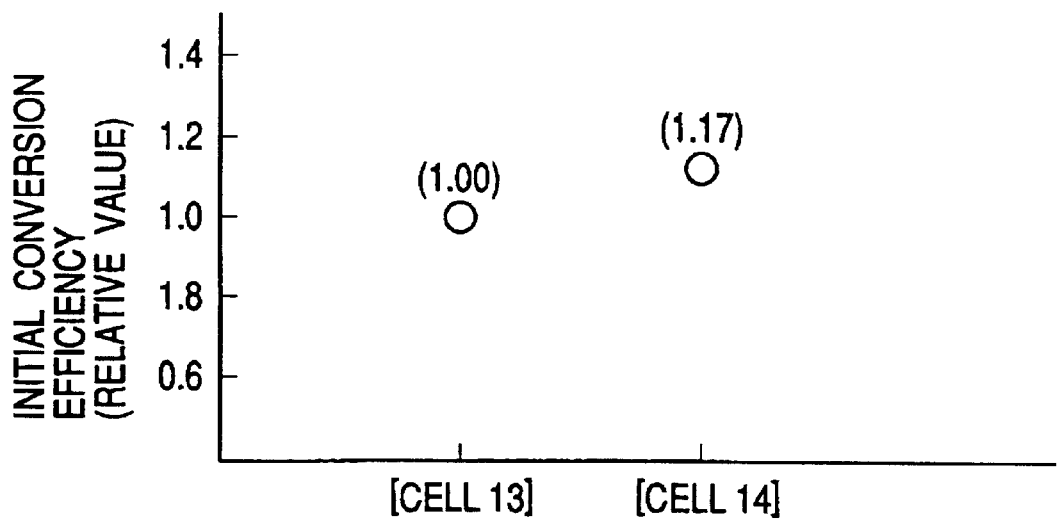
FIG. 24 diagrammatically illustrates examples of initial conversion efficiencies of photovoltaic devices.
Figure 25:
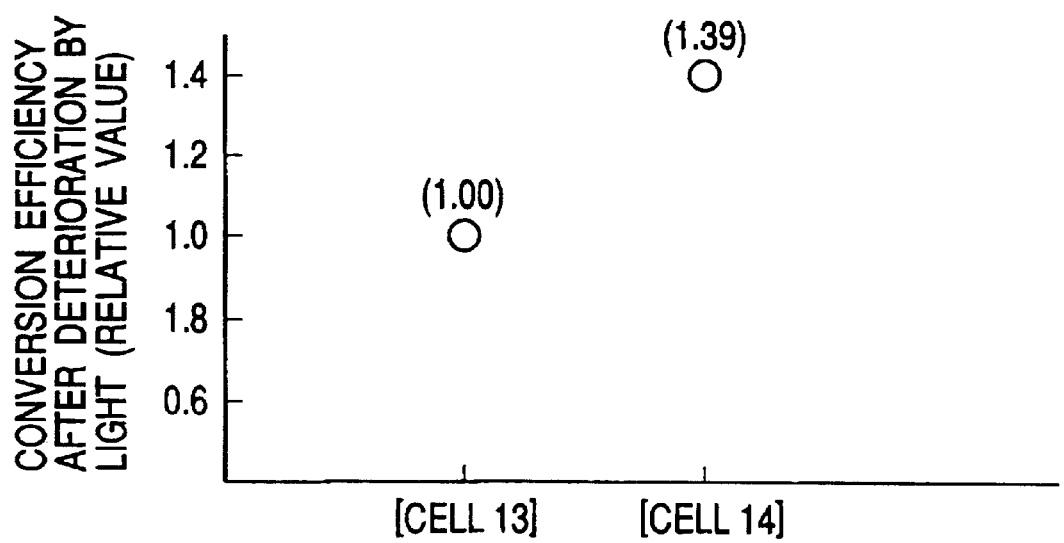
FIG. 25 diagrammatically illustrates examples of conversion efficiencies of the photovoltaic devices after deterioration by light.

FIG. 24 diagrammatically illustrates comparison of initial conversion efficiencies of Cell 13 and Cell 14, and FIG. 25 diagrammatically illustrates comparison of conversion efficiencies of Cell 13 and Cell 14 after subjecting them to a test of deterioration by light under conditions of 1 SUN, 50° C. and 500 hours. Cell 14 is superior to Cell 13 in both initial conversion efficiency and conversion efficiency after the deterioration by light. Accordingly, the superiority of the double cell according to the present invention was able to be confirmed.

According to the present invention, as described above, good-quality microcrystalline silicon films can be formed in a high deposition rate region of at least 5 Å/s. The microcrystalline silicon films according to the present invention are suitable for use as photoelectric conversion layers of photovoltaic devices, have a high conversion efficiency at low cost, permit the realization of photovoltaic devices having high light stability and are suitable for use in thin film semiconductor devices such as thin film solar cells and thin film transistors.

What is claimed is:

1. A method of forming a microcrystalline silicon film with a raw gas containing at least a silicon compound by a high frequency plasma CVD method, wherein the formation of the film is conducted such that the residence time $\tau$ (ms) of the raw gas in a film deposition chamber, which is defined as $\tau$ (ms)=78.9× V×P/M in which V is a volume ($cm^3$) of the deposition chamber, P is a deposition pressure (Torr) and M is a total flow rate (sccm) of the raw gas, satisfies $\tau<40$, and wherein a frequency of a high-frequency power source is 50 MHz or more and does not exceed 550 MHz, a temperature of a substrate is 150° C. or more and does not exceed 500° C., a deposition pressure is 0.01 Torr or more and does not exceed 0.5 Torr, and a power density of a high frequency is 0.001 $W/cm^3$ or more and does not exceed 0.5 $W/cm^3$.

2. The method of forming a microcrystalline silicon film according to claim 1, wherein when the frequency of the high-frequency power source is 50 MHz or more and does not exceed 200 MHz, the substrate temperature is 150° C. or more and does not exceed 500° C., the deposition pressure is 0.1 Torr or more and does not exceed 0.5 Torr, and the power density of the high frequency is 0.001 $W/cm^3$ or more and does not exceed 0.2 $W/cm^3$.

3. The method of forming a microcrystalline silicon film according to claim 1, wherein when the frequency of the high-frequency power source is 200 MHz or more and does not exceed 550 MHz, the substrate temperature is 150° C. or more and does not exceed 500° C., the deposition pressure is 0.01 Torr or more and does not exceed 0.3 Torr, and the power density of the high frequency is 0.01 $W/cm^3$ or more and does not exceed 0.5 $W/cm^3$.

4. A method of forming a microcrystalline silicon film with a raw gas containing at least a silicon compound by a high frequency plasma CVD method, wherein the formation of the film is conducted such that the residence time $\tau$ (ms) of the raw gas in a film deposition chamber, which is defined as $\tau$ (ms)=78.9× V×P/M in which V is a volume ($cm^3$) of the deposition chamber, P is a deposition pressure (Torr) and M is a total flow rate (sccm) of the raw gas, satisfies $\tau<40$, and wherein the total flow rate of the raw gas comprising a silicon compound gas and a diluent gas is at least 50 sccm, and a ratio of the diluent gas to the silicon compound gas is at least 20.

5. The method of forming a microcrystalline silicon film according to claim 4, wherein the total flow rate of the raw gas comprising a silicon compound gas and a diluent gas is at least 1,000 sccm, and a ratio of the diluent gas to the silicon compound gas is at least 25.

6. A method of forming a microcrystalline silicon film with a raw gas containing at least a silicon compound by a high frequency plasma CVD method, wherein the formation of the film is conducted such that the residence time $\tau$ (ms) of the raw gas in a film deposition chamber, which is defined as $\tau$ (ms)=78.9× V×P/M in which V is a volume ($cm^3$) of the deposition chamber, P is a deposition pressure (Torr) and M is a total flow rate (sccm) of the raw gas, satisfies $\tau<40$, and wherein a deposition rate of the microcrystalline silicon film is at least 5 Å/s.

7. The method of forming a microcrystalline silicon film according to claim 6, wherein a deposition rate of the microcrystalline silicon film is at least 10 Å/s.

8. A method of forming a microcrystalline silicon film with a raw gas containing at least a silicon compound by a high frequency plasma CVD method, wherein the formation of the film is conducted such that the residence time $\tau$ (ms) of the raw gas in a film deposition chamber, which is defined as $\tau$ (ms)=78.9× V×P/M in which V is a volume ($cm^3$) of the deposition chamber, P is a deposition pressure (Torr) and M is a total flow rate (sccm) of the raw gas, satisfies $\tau<40$, and wherein a second high frequency, which does not substantially contribute to the decomposition of the raw gas, is superimposed on the plasma.

9. A method of forming a microcrystalline silicon film with a raw gas containing at least a silicon compound by a high frequency plasma CVD method, wherein the formation of the film is conducted such that the residence time $\tau$ (ms) of the raw gas in a film deposition chamber, which is defined as $\tau$ (ms)=78.9× V×P/M in which V is a volume ($cm^3$) of the deposition chamber, P is a deposition pressure (Torr) and M is a total flow rate (sccm) of the raw gas, satisfies $\tau<40$, and wherein supply powers from first and second high frequency power sources are controlled such that self-bias voltages of first and second high frequencies become respective fixed values.

\* \* \* \* \*

UNITED STATES PATENT AND TRADEMARK OFFICE
CERTIFICATE OF CORRECTION

PATENT NO. : 6,488,995 B1
DATED : December 3, 2002
INVENTOR(S) : Tomonori Nishimoto et al.

It is certified that error appears in the above-identified patent and that said Letters Patent is hereby corrected as shown below:

Column 1,
Line 54, "i- type" should read -- i-type --.

Column 2,
Line 9, "n- type" should read -- n-type --;
Line 60, "pin- type" should read -- pin-type --; and
Line 61, "i- type" should read -- i-type --.

Column 5,
Line 52, "does" should read -- does not --; and
Line 53, "not" should be deleted.

Column 6,
Line 46, "does substantially not" should read -- does not substantially --.

Column 8,
Line 36, "sides" should read -- side --.

Column 9,
Line 15, "$Bi_2O_3MoO_3$," should read -- $Bi_2O_3$, $MoO_3$, --.

Column 19,
Line 63, "does" should read -- does not --;
Line 64, "not" should be deleted; and
Line 65, "and" should read -- and cases where the RF bias voltage was --.

UNITED STATES PATENT AND TRADEMARK OFFICE
CERTIFICATE OF CORRECTION

PATENT NO. : 6,488,995 B1
DATED : December 3, 2002
INVENTOR(S) : Tomonori Nishimoto et al.

It is certified that error appears in the above-identified patent and that said Letters Patent is hereby corrected as shown below:

Column 20,
Line 39, "is" should be deleted; and
Line 49, "that" should read -- that fabricated --.

Signed and Sealed this

Ninth Day of September, 2003

JAMES E. ROGAN
*Director of the United States Patent and Trademark Office*